US011937424B2

(12) United States Patent
Herner et al.

(10) Patent No.: US 11,937,424 B2
(45) Date of Patent: Mar. 19, 2024

(54) THIN-FILM STORAGE TRANSISTORS IN A 3-DIMENSIONAL ARRAY OF NOR MEMORY STRINGS AND PROCESS FOR FABRICATING THE SAME

(71) Applicant: SUNRISE MEMORY CORPORATION, San Jose, CA (US)

(72) Inventors: Scott Brad Herner, Portland, OR (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 185 days.

(21) Appl. No.: 17/458,029

(22) Filed: Aug. 26, 2021

(65) Prior Publication Data
US 2022/0068951 A1 Mar. 3, 2022

Related U.S. Application Data

(60) Provisional application No. 63/072,771, filed on Aug. 31, 2020.

(51) Int. Cl.
*H10B 43/20* (2023.01)

(52) U.S. Cl.
CPC .................................. *H10B 43/20* (2023.02)

(58) Field of Classification Search
CPC ........ H10B 43/20; H10B 41/30; H10B 43/30; H10B 51/30; H10B 53/30; H10B 10/125;
(Continued)

(56) References Cited

U.S. PATENT DOCUMENTS

| | | |
|---|---|---|
| 5,583,808 A | 12/1996 | Brahmbhatt |
| 5,646,886 A | 7/1997 | Brahmbhatt |

(Continued)

FOREIGN PATENT DOCUMENTS

| | | |
|---|---|---|
| CN | 203760476 U | 8/2014 |
| JP | 2010-010349 A2 | 1/2010 |

(Continued)

OTHER PUBLICATIONS

"EP Extended Search Report EP168690149.3", dated Oct. 18, 2019.
(Continued)

*Primary Examiner* — Shahed Ahmed
*Assistant Examiner* — Khatib A Rahman
(74) *Attorney, Agent, or Firm* — Edward C. Kwok; VLP Law Group LLP

(57) ABSTRACT

A thin-film storage transistor formed in a memory array above a planar surface of a semiconductor substrate, includes (a) first and second planar dielectric layers, each being substantially parallel the planar surface of the semiconductor substrate; (b) a first semiconductor layer of a first conductivity having an opening therein; (c) second and third semiconductor layers of a second conductivity type opposite the first conductivity type, located on two opposite sides of the first semiconductor layer; (d) a charge-storage layer provided in the opening adjacent and in contact with the first semiconductor layer; and (e) a first conductor provided in the opening separated from the first semiconductor layer by the charge storage layer, wherein the first, second and third semiconductor layers are each provided as a planar layer of materials between the first and second dielectric layers. In this configuration, the first, second and third semiconductor layers and the first conductor provide a channel region, a drain region, a source region and a gate electrode of the thin-film storage transistor.

15 Claims, 25 Drawing Sheets

(58) Field of Classification Search
CPC ......... H01L 29/40117; H01L 29/4234–42352;
H01L 29/518; H01L 29/792–7926
See application file for complete search history.

(56) References Cited

U.S. PATENT DOCUMENTS

| | | | |
|---|---|---|---|
| 5,656,842 A | 8/1997 | Iwamatsu | |
| 5,768,192 A | 6/1998 | Eitan | |
| 5,789,776 A | 8/1998 | Lancaster et al. | |
| 5,915,167 A | 6/1999 | Leedy | |
| 6,040,605 A | 3/2000 | Sano et al. | |
| 6,107,133 A | 8/2000 | Furukawa et al. | |
| 6,118,171 A | 9/2000 | Davies et al. | |
| 6,130,838 A | 10/2000 | Kim et al. | |
| 6,313,518 B1 | 11/2001 | Ahn et al. | |
| 6,362,508 B1 | 3/2002 | Rasovaky et al. | |
| 6,434,053 B1 | 8/2002 | Fujiwara | |
| 6,580,124 B1 | 6/2003 | Cleeves et al. | |
| 6,744,094 B2 | 6/2004 | Forbes | |
| 6,754,105 B1 | 6/2004 | Chang et al. | |
| 6,774,458 B2 | 8/2004 | Fricke et al. | |
| 6,781,858 B2 | 8/2004 | Fricke et al. | |
| 6,873,004 B1 | 3/2005 | Han et al. | |
| 6,946,703 B2 | 9/2005 | Ryu et al. | |
| 7,005,350 B2 | 2/2006 | Walker et al. | |
| 7,223,653 B2 | 5/2007 | Cheng et al. | |
| 7,307,308 B2 | 12/2007 | Lee | |
| 7,349,250 B2 | 3/2008 | Ito et al. | |
| 7,489,002 B2 | 2/2009 | Forbes et al. | |
| 7,512,012 B2 | 3/2009 | Kuo | |
| 7,524,725 B2 | 4/2009 | Chung | |
| 7,612,411 B2 | 11/2009 | Walker | |
| 8,026,521 B1 | 9/2011 | Or-Bach et al. | |
| 8,139,418 B2 | 3/2012 | Carman | |
| 8,178,396 B2 | 5/2012 | Sinha et al. | |
| 8,278,183 B2 | 10/2012 | Lerner | |
| 8,383,482 B2 | 2/2013 | Kim et al. | |
| 8,630,114 B2 | 1/2014 | Lue | |
| 8,743,612 B2 | 6/2014 | Choi et al. | |
| 8,767,473 B2 | 7/2014 | Shim et al. | |
| 8,848,425 B2 | 9/2014 | Schloss | |
| 8,878,278 B2 | 11/2014 | Alsmeier et al. | |
| 8,923,057 B2 | 12/2014 | Son et al. | |
| 9,190,293 B2 | 11/2015 | Wang et al. | |
| 9,202,694 B2 | 12/2015 | Konevecki et al. | |
| 9,230,985 B1 | 1/2016 | Wu et al. | |
| 9,245,900 B2 | 1/2016 | Hosoda et al. | |
| 9,397,114 B2 | 7/2016 | Yun et al. | |
| 9,412,752 B1 | 8/2016 | Yeh et al. | |
| 9,698,152 B2 | 7/2017 | Peri | |
| 9,711,529 B2 | 7/2017 | Hu et al. | |
| 9,748,172 B2 | 8/2017 | Takaki | |
| 9,842,651 B2 | 12/2017 | Harari | |
| 9,892,800 B2 | 2/2018 | Harari | |
| 9,911,497 B1 | 3/2018 | Harari | |
| 10,014,317 B2 | 7/2018 | Peng | |
| 10,074,667 B1 | 9/2018 | Higashi | |
| 10,096,364 B2 | 10/2018 | Harari | |
| 10,121,553 B2 | 11/2018 | Harari | |
| 10,157,780 B2 | 12/2018 | Wu et al. | |
| 10,249,370 B2 | 4/2019 | Harari | |
| 10,254,968 B1 | 4/2019 | Gazit et al. | |
| 10,373,956 B2 | 8/2019 | Gupta et al. | |
| 10,381,378 B1 | 8/2019 | Harari | |
| 10,395,737 B2 | 8/2019 | Harari | |
| 10,431,596 B2* | 10/2019 | Herner | H01L 29/0847 |
| 10,475,812 B2 | 11/2019 | Harari | |
| 10,622,377 B2 | 4/2020 | Harari et al. | |
| 11,227,896 B2* | 1/2022 | Noh | H10B 63/84 |
| 11,854,857 B1 | 12/2023 | Or-Bach | |
| 2001/0030340 A1 | 10/2001 | Fujiwara | |
| 2001/0053092 A1* | 12/2001 | Kosaka | G11C 16/0466 365/185.19 |
| 2002/0028541 A1 | 3/2002 | Lee et al. | |
| 2002/0051378 A1 | 5/2002 | Ohsawa | |
| 2002/0193484 A1 | 12/2002 | Albee | |
| 2004/0000679 A1 | 1/2004 | Patel et al. | |
| 2004/0214387 A1 | 10/2004 | Madurawe et al. | |
| 2004/0246807 A1 | 12/2004 | Lee | |
| 2004/0262681 A1 | 12/2004 | Masuoka et al. | |
| 2004/0262772 A1 | 12/2004 | Ramanathan et al. | |
| 2005/0128815 A1 | 6/2005 | Ishikawa et al. | |
| 2005/0236625 A1 | 10/2005 | Schuele et al. | |
| 2005/0280061 A1 | 12/2005 | Lee | |
| 2006/0155921 A1 | 7/2006 | Gorobets et al. | |
| 2008/0160765 A1 | 7/2008 | Lee et al. | |
| 2008/0239812 A1 | 10/2008 | Naofumi et al. | |
| 2008/0266960 A1 | 10/2008 | Kuo | |
| 2009/0057722 A1 | 3/2009 | Masuoka et al. | |
| 2009/0157946 A1 | 6/2009 | Arya | |
| 2009/0237996 A1 | 9/2009 | Kirsch et al. | |
| 2009/0279360 A1 | 11/2009 | Peter et al. | |
| 2009/0316487 A1 | 12/2009 | Lee et al. | |
| 2010/0124116 A1 | 5/2010 | Takashi et al. | |
| 2011/0047325 A1 | 2/2011 | Mishima | |
| 2011/0115011 A1 | 5/2011 | Masuoka et al. | |
| 2011/0143519 A1 | 6/2011 | Lerner | |
| 2011/0208905 A1 | 8/2011 | Shaeffer et al. | |
| 2011/0298013 A1* | 12/2011 | Hwang | H10B 43/27 257/365 |
| 2012/0074478 A1 | 3/2012 | Sugimachi | |
| 2012/0182801 A1 | 7/2012 | Lue | |
| 2012/0223380 A1 | 9/2012 | Lee et al. | |
| 2012/0243314 A1 | 9/2012 | Takashi | |
| 2012/0307568 A1 | 12/2012 | Banna et al. | |
| 2012/0327714 A1 | 12/2012 | Lue | |
| 2013/0171788 A1 | 7/2013 | Yang et al. | |
| 2013/0256780 A1 | 10/2013 | Kai et al. | |
| 2013/0337646 A1 | 12/2013 | Cernea et al. | |
| 2014/0015036 A1 | 1/2014 | Fursin et al. | |
| 2014/0040698 A1 | 2/2014 | Loh et al. | |
| 2014/0117366 A1 | 5/2014 | Saitoh | |
| 2014/0151774 A1 | 6/2014 | Rhie | |
| 2014/0213032 A1 | 7/2014 | Kai et al. | |
| 2014/0247674 A1 | 9/2014 | Karda et al. | |
| 2014/0252454 A1 | 9/2014 | Rabkin | |
| 2014/0252532 A1 | 9/2014 | Yang et al. | |
| 2014/0328128 A1 | 11/2014 | Louie et al. | |
| 2014/0340952 A1 | 11/2014 | Ramaswamy et al. | |
| 2015/0079743 A1 | 3/2015 | Pachamuthu et al. | |
| 2015/0079744 A1 | 3/2015 | Hwang | |
| 2015/0129955 A1 | 5/2015 | Mueller et al. | |
| 2015/0187823 A1 | 7/2015 | Miyairi et al. | |
| 2015/0194440 A1 | 7/2015 | Noh et al. | |
| 2015/0206886 A1 | 7/2015 | Guha et al. | |
| 2015/0249143 A1 | 9/2015 | Sano | |
| 2015/0340371 A1 | 11/2015 | Lui | |
| 2015/0372099 A1 | 12/2015 | Chen et al. | |
| 2016/0019951 A1 | 1/2016 | Park et al. | |
| 2016/0049404 A1 | 2/2016 | Mariani et al. | |
| 2016/0086953 A1 | 3/2016 | Liu | |
| 2016/0086970 A1 | 3/2016 | Peng | |
| 2016/0141294 A1 | 5/2016 | Peri et al. | |
| 2016/0225860 A1 | 8/2016 | Karda et al. | |
| 2016/0314042 A1 | 10/2016 | Plants | |
| 2017/0053906 A1 | 2/2017 | Or-Bach et al. | |
| 2017/0092370 A1 | 3/2017 | Harari | |
| 2017/0092371 A1 | 3/2017 | Harari | |
| 2017/0148517 A1 | 5/2017 | Harari | |
| 2017/0148810 A1 | 5/2017 | Kai et al. | |
| 2017/0358594 A1 | 12/2017 | Lu et al. | |
| 2018/0108416 A1 | 4/2018 | Harari | |
| 2018/0151419 A1 | 5/2018 | Wu et al. | |
| 2018/0269229 A1 | 9/2018 | Or-Bach et al. | |
| 2018/0342455 A1 | 11/2018 | Nosho et al. | |
| 2018/0366471 A1 | 12/2018 | Harari et al. | |
| 2018/0366485 A1 | 12/2018 | Harari | |
| 2018/0366489 A1* | 12/2018 | Harari | H10B 43/27 |
| 2019/0006009 A1 | 1/2019 | Harari | |
| 2019/0019564 A1 | 1/2019 | Li et al. | |
| 2019/0157296 A1 | 5/2019 | Harari et al. | |
| 2019/0180821 A1 | 6/2019 | Harari | |
| 2019/0206890 A1* | 7/2019 | Harari | H10B 43/35 |
| 2019/0244971 A1 | 8/2019 | Harari | |

(56) References Cited

U.S. PATENT DOCUMENTS

| | | | |
|---|---|---|---|
| 2019/0259769 | A1 | 8/2019 | Karda et al. |
| 2019/0325964 | A1 | 10/2019 | Harari |
| 2019/0319044 | A1 | 11/2019 | Harari |
| 2019/0348424 | A1 | 11/2019 | Karda et al. |
| 2019/0348437 | A1 | 11/2019 | Fukuzumi et al. |
| 2019/0355747 | A1 | 11/2019 | Herner et al. |
| 2019/0370117 | A1 | 12/2019 | Fruchtman et al. |
| 2020/0020718 | A1 | 1/2020 | Harari et al. |
| 2020/0051990 | A1 | 2/2020 | Harari et al. |
| 2020/0098738 | A1 | 3/2020 | Herner et al. |
| 2020/0098779 | A1 | 3/2020 | Cernea et al. |
| 2020/0176468 | A1 | 6/2020 | Herner et al. |
| 2020/0176475 | A1 | 6/2020 | Harari |
| 2020/0185411 | A1* | 6/2020 | Herner .............. H01L 21/31144 |
| 2020/0203378 | A1 | 6/2020 | Harari et al. |
| 2020/0219572 | A1 | 7/2020 | Harari |
| 2020/0258897 | A1 | 8/2020 | Yan et al. |

FOREIGN PATENT DOCUMENTS

| | | | |
|---|---|---|---|
| KR | 20120085591 | A1 | 8/2012 |
| WO | 2018236937 | A1 | 12/2018 |

OTHER PUBLICATIONS

"European Search Report, EP 16852238.1", dated Mar. 28, 2019.

"European Search Report, EP17844550.8", dated Aug. 12, 2020, 11 pages.

"Notification of Reasons for Refusal, Japanese Patent Application 2018-527740", (English translation), dated Nov. 4, 2020, 8 pages.

"Partial European Search Report EP 16869049.3", dated Jul. 1, 2019, pp. 1-12.

"PCT Search Report and Written Opinion, PCT/US2018/038373", dated Sep. 10, 2018.

"PCT Search Report and Written Opinion, PCT/US2018/067338", dated May 8, 2019.

"PCT Search Report and Written Opinion, PCT/US2019/014319", dated Apr. 15, 2019.

"PCT Search Report and Written Opinion, PCT/US2019/041678", dated Oct. 9, 2019.

"PCT Search Report and Written Opinion, PCT/US2019/052446", dated Dec. 11, 2019.

"PCT Search Report and Written Opinion, PCT/US2020/065670", dated Apr. 5, 2021, 12 pages.

Kim, N., et al., "Multi-layered Vertical gate NANO Flash Overcoming Stacking Limit for Terabit Density Storage", Symposium on VLSI Tech. Dig. of Technical Papers, 2009, pp. 188-189.

Lue, H.T., et al., "A Highly Scalable 8-Layer 3D Vertical-gate {Vg} TFT NANO Flash Using Junction-Free Buried Channel BE-SONOS Device", Symposium on VLSI: Tech. Dig. Of Technical Papers, 2010, pp. 131-132.

Tanaka, T., et al., "A 768 Gb 3b/cell 3D-Floating-Gate NANO Flash Memory", Digest of Technical Papers, the 2016 EEE International Solid-Slate Circuits Conference, 2016, pp. 142-144.

Wann, H.C., et al., "High-Endurance Ultra-Thin Tunnel Oxide in Monos Device Structure for Dynamic Memory Application", IEEE Electron Device letters, vol. 16, No. 11, Nov. 1995, pp. 491-493.

"PCT Search Report and Written Opinion, PCT/US2021/047803", dated Nov. 23, 2021, 15 pages.

"PCT Search Report and Written Opinion, PCT/US2021/42620", dated Oct. 28, 2021, 18 pages.

* cited by examiner

THIN-FILM STORAGE TRANSISTORS IN A 3-DIMENSIONAL ARRAY OF NOR MEMORY STRINGS AND PROCESS FOR FABRICATING THE SAME

CROSS-REFERENCE TO RELATED APPLICATIONS

This present application relates to and claims priority of U.S. provisional patent application ("Related Application I"), Ser. No. 63/072,771, entitled "Thin-film Storage Transistors in a 3-Dimensional NOR Memory Array and Process for Fabricating The Same," filed on Aug. 31, 2020.

The present application is also related to (i) U.S. provisional patent application ("Related Application II"), Ser. No. 63/054,750, entitled "Methods for Fabricating a 3-Dimensional Memory Structure of NOR Memory Strings," filed on Jul. 21, 2020; (ii) U.S. patent application ("Related Application III"), Ser. No. 16/510,610, entitled "Fabrication Method For a 3-Dimensional NOR Memory Array," filed on Jul. 12, 2019; (iii) U.S. patent application ("related Application IV"), Ser. No. 16/894,624, entitled "3-Dimensional NOR Memory Array With Very Fine Pitch: Device and Method," filed Jun. 5, 2020; and (iv) U.S. provisional patent application ("Related Application V"), Ser. No. 62/950,390, entitled "Process For Preparing A Channel Region Of A Thin-Film Transistor In A 3-Dimensional Thin-Film Transistor Array," filed on Dec. 19, 2019.

The disclosures of Related Applications I-V (collectively, the "Related Applications") are hereby incorporated by reference in their entireties.

BACKGROUND OF THE INVENTION

1. Field of the Invention

The present invention relates to memory integrated circuits and processes for their manufacturing. In particular, the present invention relates to thin-film storage transistors in a 3-dimensional memory structure formed on a planar surface of a semiconductor substrate and processes for their manufacturing.

2. Discussion of the Related Art

High density memory arrays, e.g., 3-dimensional arrays of NOR memory strings ("3-D NOR memory arrays"), are disclosed in, for example, U.S. Patent Application Publication 2017/0092371A1 ("Structural Reference I"), entitled "Capacitive-Coupled Non-Volatile Thin-film Transistor Strings in Three-Dimensional Arrays," and U.S. Patent Application Publication 2018/0366489A1 ("Structural Reference II"), entitled "3-Dimensional NOR Memory Array Architecture and Methods for Fabrication Thereof." The disclosures of Structural References I and II (collectively, "Structural References") are hereby incorporated by reference in their entireties. In addition to providing high memory density and high capacity, these 3-D NOR memory arrays are memory circuits operating at highly desirable speeds that rival conventional memory circuits of much lower circuit densities and significantly higher power dissipation (e.g., as dynamic random-access memories or "DRAMs").

In some of the Related Applications, forming the channel regions of thin-film storage transistors in a 3-D NOR memory array is challenging, as device and process complexities (e.g., highly constraining thermal budget) restrict the choices of available reagents and materials.

SUMMARY

According to one embodiment of the present invention, thin-film storage transistors in a 3-D NOR memory array are structured to allow their channel regions to be formed at an early stage of its fabrication process. The fabrication processes for these thin-film storage transistors have advantages (e.g., fewer photo-lithographical steps) over some of the processes disclosed in the Related Applications. For example, according to one embodiment, a process for fabricating the 3-D memory array of the present invention has fewer masking steps, as it requires less global word line layers. According to another embodiment, by judiciously forming the gate electrodes before forming the source and drains regions, the process obviates safeguards intended to ensure minimal dopant diffusion between the source or drain regions and the channel regions. The thin-film storage transistors of the present invention may sustain higher currents relative to those disclosed in the Structural References without compromising memory density.

According to one embodiment of the present invention, a thin-film storage transistor formed in a memory array above a planar surface of a semiconductor substrate, includes (a) first and second planar dielectric layers, each being substantially parallel the planar surface of the semiconductor substrate; (b) a first semiconductor layer of a first conductivity having an opening therein; (c) second and third semiconductor layers of a second conductivity type opposite the first conductivity type, located on two opposite sides of the first semiconductor layer; (d) a charge-storage layer provided in the opening adjacent and in contact with the first semiconductor layer; and (e) a first conductor provided in the opening separated from the first semiconductor layer by the charge storage layer, wherein the first, second and third semiconductor layers are each provided as a planar layer of materials between the first and second dielectric layers. In this configuration, the first, second and third semiconductor layers and the first conductor provide a channel region, a drain region, a source region and a gate electrode of the thin-film storage transistor. The thin-film storage transistor may further include second and third conductors adjacent and in electrical contact with the second and third semiconductor layers, respectively, to serve as shunts to reduce resistivity in the source and drain regions. The first conductor serves as a gate electrode for the thin-film storage transistor.

In one embodiment, the charge storage layer is a multi-layer including as components a tunneling dielectric layer, a charge-trapping layer and a blocking dielectric layer. In one embodiment, at least a portion of the charge-storage layer is provided in a recessed portion of the first semiconductor region from the opening. The charge-storage layer may surround the gate electrode providing a large capacitance to achieve low variations in threshold voltages among the thin-film storage transistors in the memory array. In another embodiment, the charge-storage layer may be divided into multiple sections (e.g., two semi-annular sections) each providing charge storage to a separate thin-film storage transistor.

In one embodiment, multiple thin-film storage transistors share the gate electrode in the opening, the opening being a vertical via through the active layers and the dielectric layers. When at least a portion of the charge-storage layer is provided in a recessed portion of the first semiconductor region of each active layer, the charge-storage layers of the thin-film storage transistors sharing the gate electrode may be separated from each other. The thin film storage transistors in the via are part of a memory array consisting of a regular array of such thin-film storage transistors situated in numerous like vias. The thin-film storage transistors formed on the same active layer may be organized as NOR memory strings.

Global word lines may be formed to connect to the gate electrodes to communicate word line signals. In one embodiment, the global word lines are formed exclusively above the memory array. In that configuration, design constraints on the global word lines are relaxed relative to providing at least some of the global word lines between the memory array and the planar surface of the semiconductor substrate.

According to one embodiment of the present invention, a process for forming the thin-film storage transistor of the present invention may include (i) providing over the planar surface numerous active layers each separated from another by a dielectric layer, each active layer includes numerous sections each having a first semiconductor region of a first conductivity type; (ii) providing in each section a charge-storage layer and a conductor by (a) forming multiple vias, wherein each via passes through the first semiconductor region of one of the sections in each active layer and the dielectric layers adjacent thereto, wherein each via extends along a direction substantially normal to the planar surface of the semiconductor substrate; (b) forming the charge storage layer conformally over the sidewalls of the via; and (c) forming the conductor by filling the via with a conductive material; and (iii) providing in each section second and third semiconductor regions of a second conductivity type, wherein each of the second and third semiconductor region are provided adjacent and in electrical contact with the first semiconductor region of the section.

In one embodiment, the process includes forming above the active layers a layer of interconnection conductors each connecting to one or more of the conductors in the filled vias.

In one embodiment, the charge-storage layer includes depositing a tunnel dielectric layer, a charge-trapping layer, and a blocking dielectric layer. The charge storage layer may be conformally formed over the sidewalls of the vias using: (a) from the sidewalls of each via, recessing each first semiconductor region of the active layers using an etchant selective to the dielectric layers to forma a cavity between the dielectric layers adjacent to the first semiconductor region; (b) forming the tunnel dielectric layer by a conformal deposition of a tunnel dielectric material to coat both the sidewalls of the via and the walls of the cavities; (c) forming the charge-trapping layer by a conformal deposition of a charge-trapping material to coat the sidewalls of the via and to fill the cavities; (d) using an anisotropic etch to remove the charge-trapping material from the sidewalls of the via; and forming the blocking dielectric layer by a conformal deposition of a blocking dielectric material. In this configuration, the charge-storage layers of the thin-film storage transistors formed sharing a common electrode would be separated from each other.

In one embodiment, the forming the conductor by filling the via with a conductive material may be carried out by: (i) filling the via with a sacrificial material in the via after the charge-storage layer is formed; (ii) patterning and removing from the via a portion of the sacrificial material to form a slit that exposes portions of the charge-storage layer; (iii) removing the exposed portions of the charge-storage layers to divide the charge-storage layer on the sidewalls of the via into isolated sections; (iv) filling the slit with a dielectric material; (v) removing all remaining sacrificial material from the via; and (vi) filling the via with the conductive material. Using this process, the charge-storage layer within the via are divided into more separate sections than the number of active layers, each section being provided to a separate one of the thin-film storage transistors. As a result, a higher storage density can be achieved.

In one embodiment, the second and third semiconductor regions may be provided in each section by (i) forming trenches through the active layers and their adjacent dielectric layers, the trenches each extending in depth substantially normal to the planar surface of the semiconductor surface; (ii) accessing from the sidewalls of the trenches, recessing the first semiconductor layer from the sidewalls using an etchant selective to the dielectric layers so as to form cavities between adjacent dielectric layers; (iii) filling the cavities by depositing into the cavities a semiconductor material of the second conductivity type to form the second and third semiconductor regions of each section; and (v) filling the trenches with a dielectric material.

By forming the common conductors in the vias prior to forming the second and third semiconductor regions, an elevated process step in forming the conductor would not cause dopants in the second and third semiconductor regions to diffuse into the first semiconductor region of the thin-film semiconductor region. As a result, higher diffusivity dopants, such as phosphorus may be used. Otherwise, arsenic is preferred. In one embodiment, however, creating the trenches and recessing the first semiconductor regions may be carried out prior to forming the common conductors in the vias. In that embodiment, a sacrificial material may be used to fill the cavities adjacent the first semiconductor regions and replaced subsequent to forming the common conductors by the second and third semiconductor regions.

The present invention is better understood upon consideration of the detailed description below in conjunction with the accompanying drawings.

BRIEF DESCRIPTION OF THE DRAWINGS

The drawings are schematic representations of various embodiments of the present disclosure and are not meant to be actual views of any particular component, structure, or device. The drawings are not to scale, and the thickness and dimensions of some layers may be exaggerated for clarity. Like reference numerals refer to like components throughout.

DETAILED DESCRIPTION OF THE PREFERRED EMBODIMENTS

Figure 1:
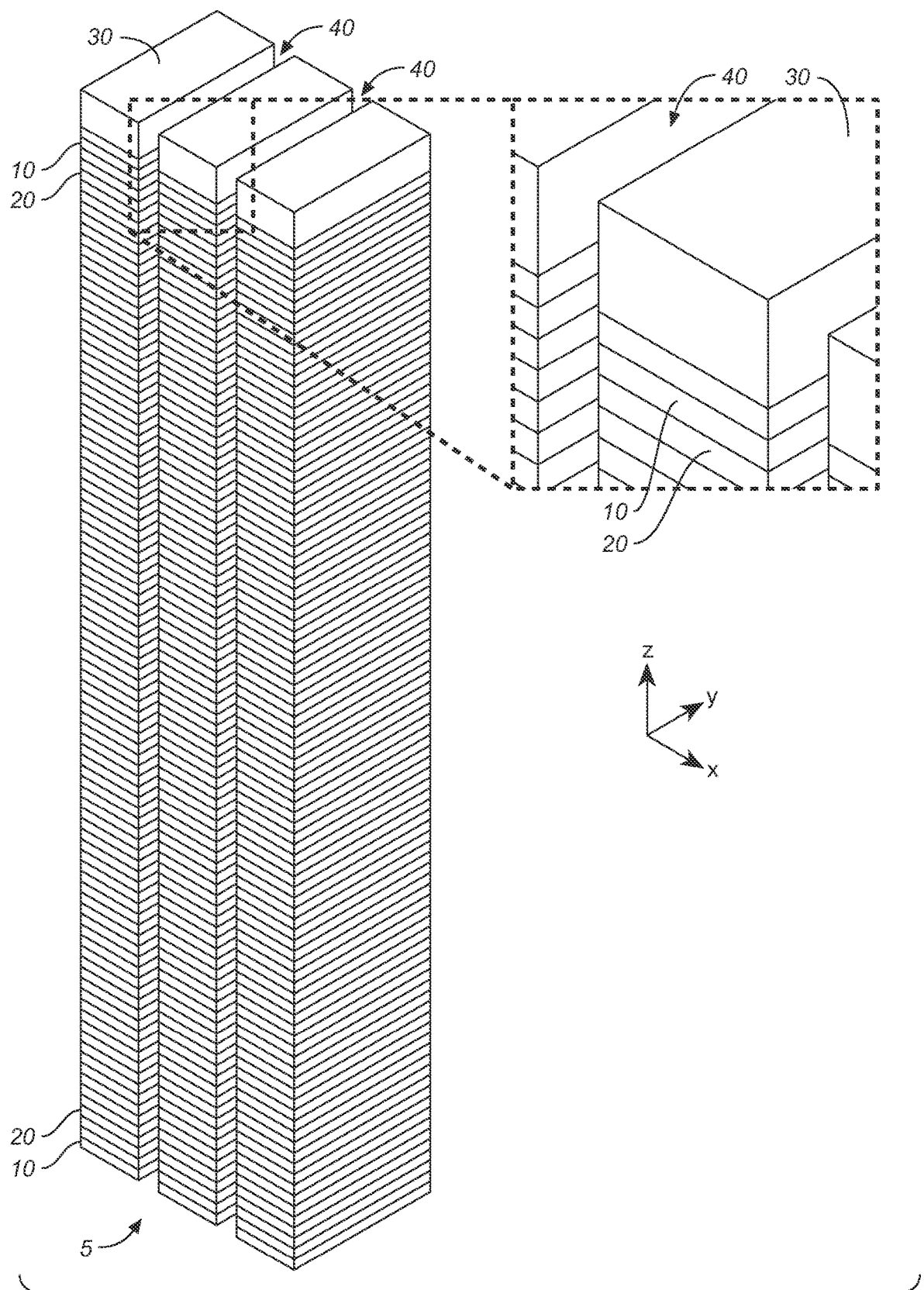
FIG. 1 shows isometric and expanded schematic views of memory structure 100 at an initial step of a fabrication process for a 3-D NOR memory array, in accordance with one embodiment of the present invention.

1. Forming Common Source Line and Common Drain Line ("Common Bit Line") Prior to Forming Local Word Lines Initially, a stack of alternately and successively deposited layers of a dielectric material ("dielectric layer")—e.g., silicon oxide or silicon nitride—and a semiconductor material (e.g., silicon) are provided on top of a planar surface of a semiconductor substrate. The semiconductor material ("silicon layers") is designed to provide the channel regions of thin-film transistors in a NOR memory array to be formed. Adjacent silicon layers are isolated from each other by the dielectric layer between them. In one embodiment, the stack of silicon and dielectric materials may be annealed at 600° C. for 12 hours to crystallize the deposited silicon material, so as to obtain low-defect grains that provide high carrier mobility. FIG. 1 shows isometric and expanded schematic views of memory structure 100, after patterning and etching of hard mask 30 provided on top of memory structure 100, in accordance with one embodiment of the present invention. Hard mask layer 30 is provided on top of memory structure 100 to provide mechanical stability. As shown in FIG. 1, memory structure 100 represents a resulting structure formed by photolithographically patterning and etching hard mask layer 30 formed on top the multiple alternating silicon and dielectric layers. The etching step divides the silicon and dielectric layers into multiple stacks ("active stacks"), with adjacent active stacks being separated by one of trenches 40.

To facilitate this detailed description, as indicated in FIG. 1, a rectilinear coordinate system is adopted, in which a normal to the planar surface of semiconductor substrate 5 is designated the Z-direction (or "vertical direction"), and two mutually orthogonal directions—each being also orthogonal to the Z-direction—are designated the X- and Y-directions, respectively. The X- and Y-directions. Relative to the Z-direction, the X- and Y-directions are each referred to as a "horizontal" direction.

In one embodiment, 48 silicon layers are deposited, with each silicon layer and each dielectric layer being, for example, 30-nm thick, so that the total thickness of all the silicon and dielectric layers reaches approximately 2.88 microns. (Of course, these values are illustrative; any suitable thickness and any suitable number of layers may be used.) Silicon layers 10 may be formed from a lightly-doped p-type silicon (e.g., with an active carrier concentration between $1\times10^{17}$ cm$^{-3}$ and $5\times10^{18}$ cm$^{-3}$). In other embodiments, silicon layers 10 may be intrinsic, as deposited, or may be n$^-$-doped. Silicon layers 10 and dielectric layers 20 may each be deposited using any suitable technique (e.g., chemical vapor deposition (CVD), plasma-enhanced CVD (PECVD), or atomic layer deposition (ALD)). Hard mask layer 30 may be formed out of silicon oxide-carbide (SiOC) or any suitable material.

In the embodiment of FIG. 1, trenches 40 (e.g., 60-nm wide) may extend along the Y-direction, provided at a 240-nm pitch along the X-direction (i.e., the distance between corresponding edges of adjacent trenches being about 240 nm along the X-direction). With these dimensions, the process module that etches through layers 10 and dielectric layers 20 (48 layers of each material) to form trenches 40 has an aspect ratio of less than 15. Trenches 40 may be etched, for example, using corrosive gases such as fluorine or chlorine.

Figure 2:
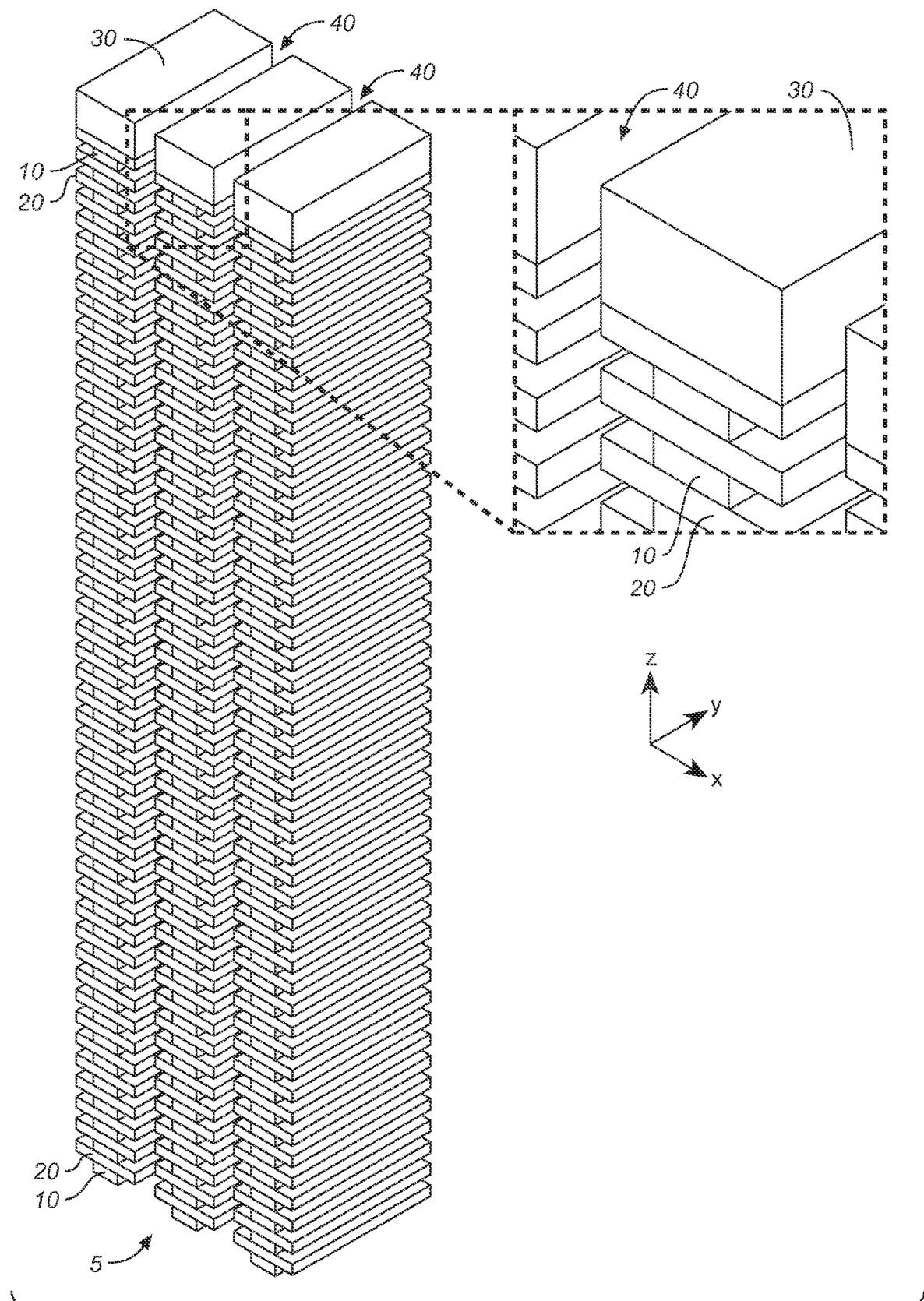
FIG. 2 shows isometric and expanded schematic views of memory structure 100 of FIG. 1, after recessing the silicon layers 10, in accordance with one embodiment of the present invention.

Thereafter, as shown in FIG. 2, silicon layers 10 may be recessed from trenches 40 using a suitable selective wet or dry (corrosive gas) etch that etches silicon layers 10 more rapidly than it etches dielectric layers 20 or hard mask layer 30 (i.e., an etch that is more selective to silicon oxide or silicon nitride, and silicon oxide-carbide). Suitable wet etch chemistries for this etch include, for example, any ammonium hydroxide-hydrogen peroxide mixture (APM), any potassium hydroxide-hydrogen peroxide mixture, and any tetramethylammonium hydroxide mixture. In the example shown, silicon layers 10 may be recessed 40 nm on each side (i.e., laterally), to leave a 100 nm width along the X-direction, although any suitable width may be used. Suitable selective dry etch chemistries include, for example, any xenon difluoride gas and any hydrogen-bromine-oxygen gas mixture.

Figure 3:
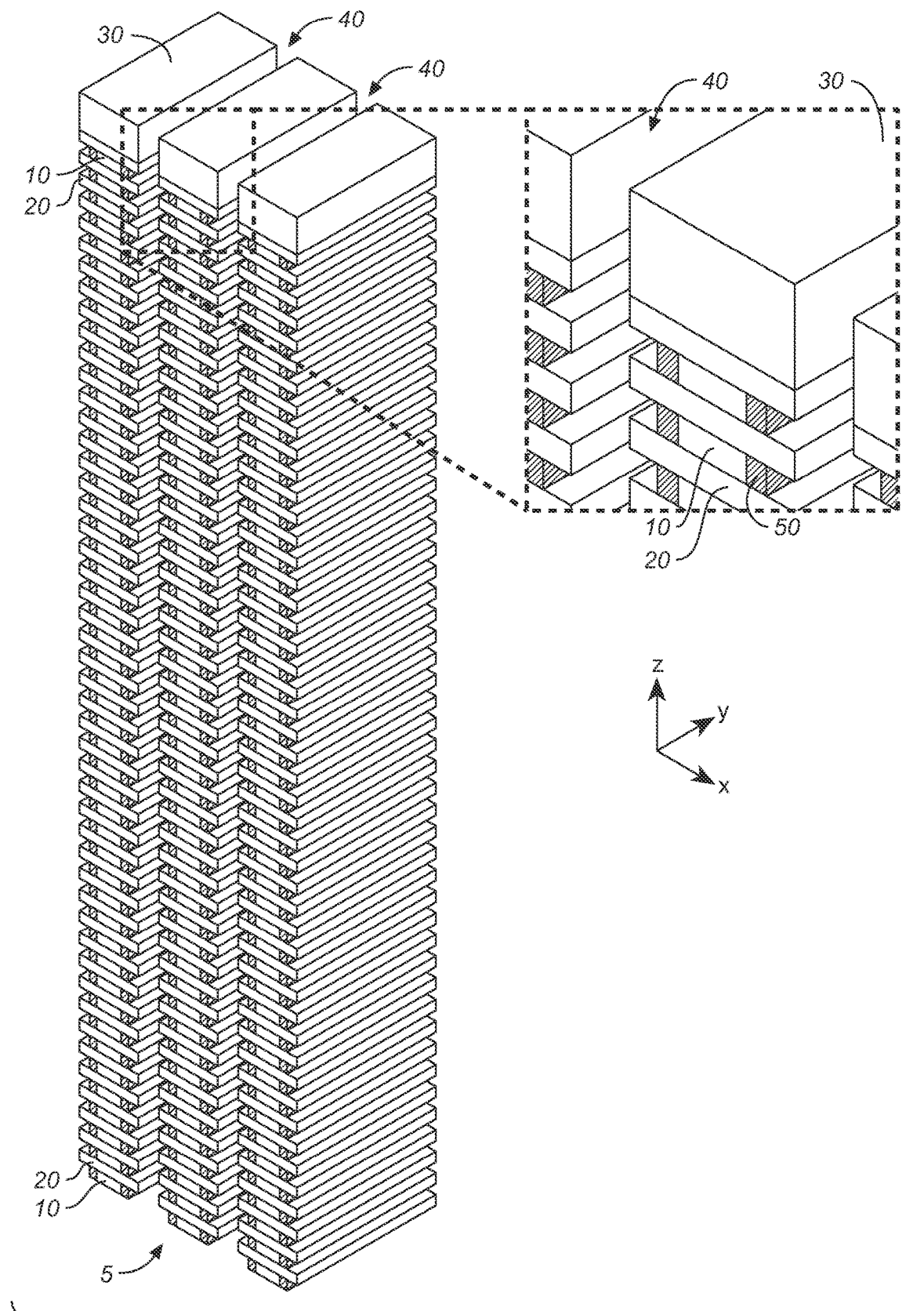
FIG. 3 shows isometric and expanded schematic views of resulting memory structure 100, after deposition and isotropic etching of heavily-doped silicon layers 50, in accordance with one embodiment of the present invention.

Then, heavily-doped silicon 50 (e.g., n$^+$-doped or p$^+$-doped polysilicon) is deposited in trenches 40, filling the cavities created by recessing silicon layers 10. An isotropic etch may be used, for example, to remove heavily-doped silicon 50 from trenches 40 and to recess heavy-doped silicon 50 from trenches 40 by 10 nm (X-direction), thereby forming cavities. FIG. 3 shows isometric and expanded schematic views of resulting memory structure 100, after deposition and isotropic etching of heavily-doped silicon 50, in accordance with one embodiment of the present invention. In this manner, strips of heavily-doped silicon 50 are formed that extend along the Y-direction. Heavily-doped silicon 50 subsequently provides a common bit line and a common source line for the thin-film storage transistors in each NOR memory string in the 3-D NOR memory array to be formed. Heavily-doped silicon 50 may be deposited using any appropriate technique (e.g., low-pressure CVD (LPCVD)). In one embodiment, heavily-doped silicon layer 50 may be arsenic-doped to a concentration of $1\times10^{20}$ cm$^{-3}$.

Figure 4:
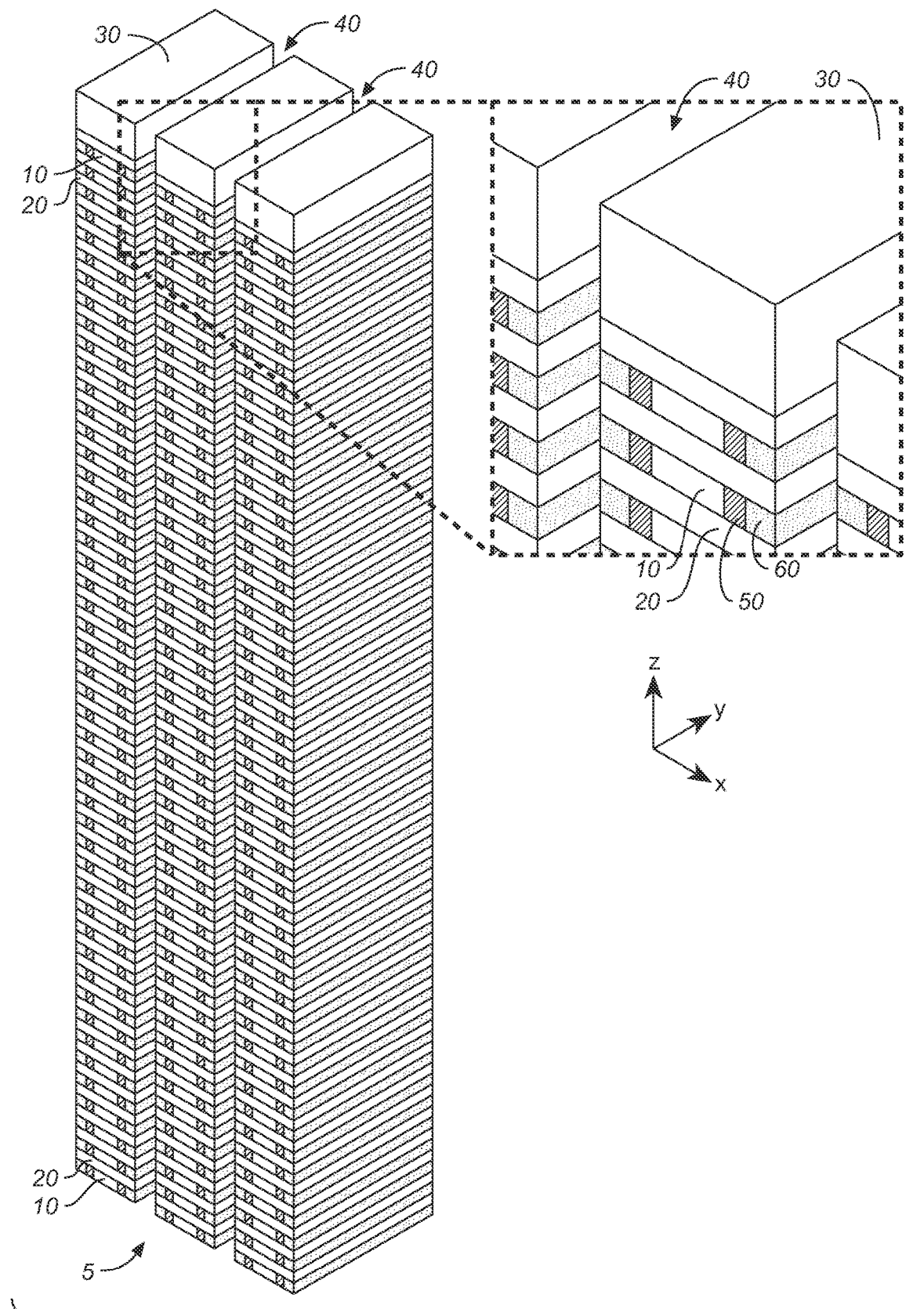
FIG. 4 shows isometric and expanded schematic views of resulting memory structure 100, after anisotropic etching of conductive material 60, in accordance with one embodiment of the present invention.

Thereafter, conductive material 60—which may be any appropriate metal, or combination of metals, that can be conformally deposited to good precision—is deposited, thereby filling the cavities in heavily-doped silicon 50. In one embodiment, conductive material 60 may deposited as a titanium nitride (TiN) liner or adhesive layer, followed by a thicker layer of tungsten (W), using ALD, CVD, or a suitable combination of ALD and CVD techniques. Conductive material 60 may then be removed from the sidewalls of trenches 40 using a selective anisotropic dry etch, wet etch, or both. A suitable anisotropic dry etch may include a suitable corrosive gas (e.g., sulfur fluoride (SF$_6$), nitrogen fluoride (NF$_3$), or carbon fluoride (CF$_4$) or any combination of these gases). FIG. 4 shows isometric and expanded schematic views of resulting memory structure 100, after anisotropic etching of conductive material 60, in accordance with one embodiment of the present invention. As shown in FIG. 4, conductive material 60 are formed as metal strips extending along the Y-direction, each metal strip being adjacent and in electrical contact with a correspond strip of heavily-doped silicon 50.

Figure 5:
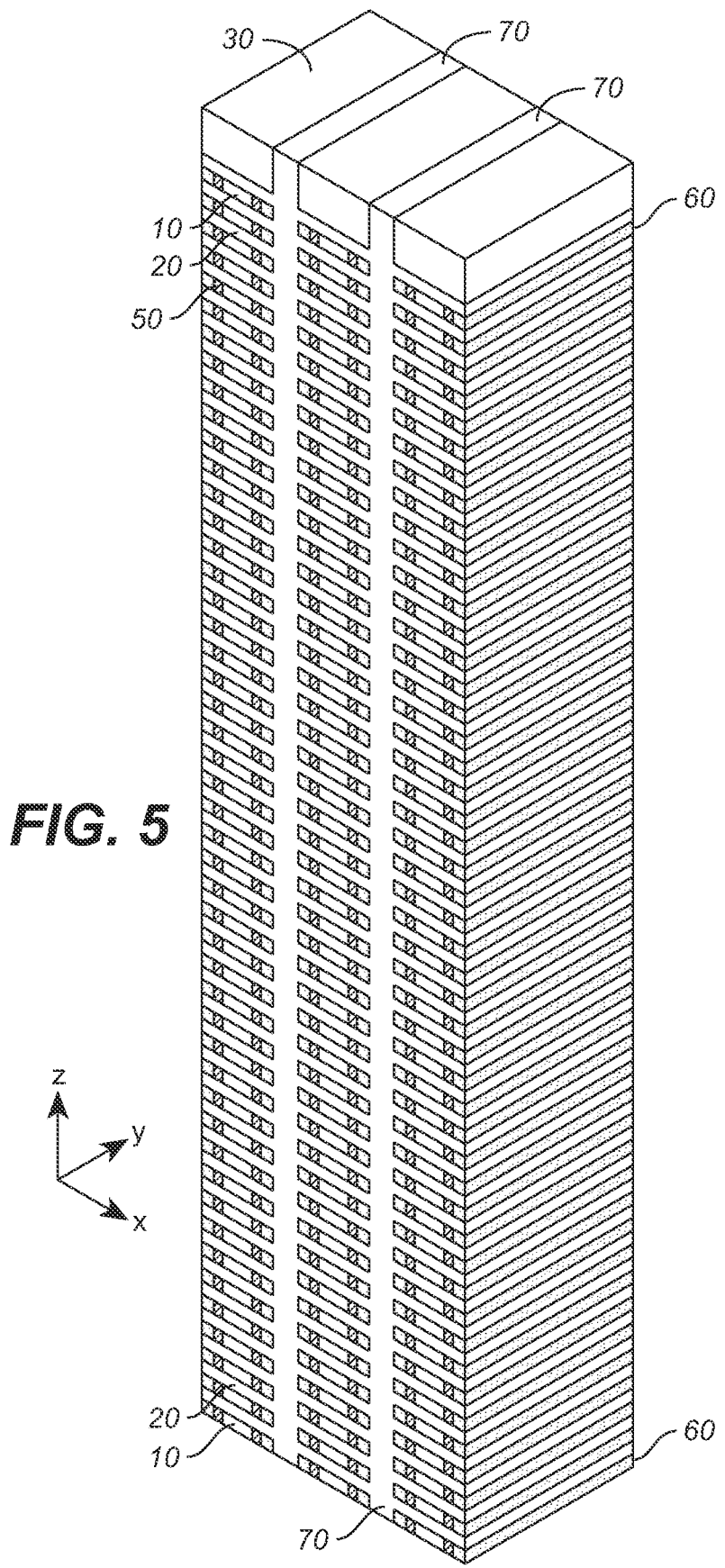
FIG. 5 shows an isometric schematic view of resulting memory structure 100, after an etch-back or CMP of dielectric material 70, in accordance with one embodiment of the present invention.

Dielectric material 70 (e.g., a silicon oxide) may be deposited by ALD and planarized by an etch-back step or a chemical-mechanical polishing (CMP) step to fill trenches 40. FIG. 5 shows an isometric schematic view of resulting memory structure 100, after an etch-back or CMP step on dielectric material 70, in accordance with one embodiment of the present invention.

Figure 6:
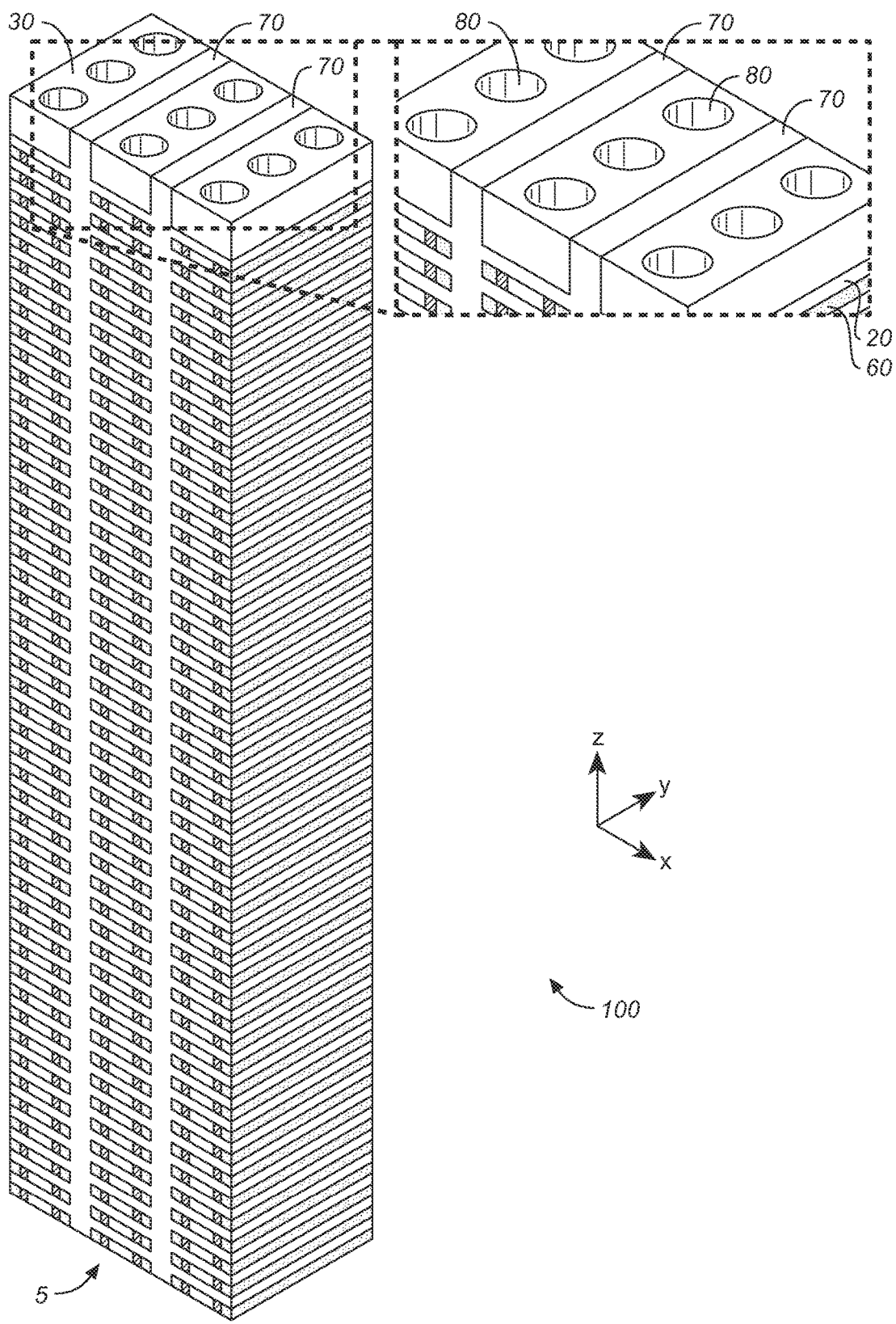
FIG. 6 shows isometric and expanded schematic views of resulting memory structure 100, after etching of vias 80, in accordance with one embodiment of the present invention.

Thereafter, hard mask 30 is patterned and etched to form numerous vias 80 in the active stacks. Vias 80 each cut through every layer of the active stacks in memory structure 100. In one embodiment, each via has an X-Y plane diameter of 120 nm, with at a 160-nm pitch along the Y-direction (i.e., adjacent vias are 160 nm apart—e.g., center-to-center—along the Y-direction). FIG. 6 shows isometric and expanded schematic views of resulting memory structure 100, after etching of vias 80, in accordance with one embodiment of the present invention. Vias 80 may be etched using substantially the same process steps as those used to form trenches 40. In one embodiment, an acceptance criterion for each 120-nm via (nominally) allows the actual diameter of each via (i.e., its "critical dimension") to be between 140 nm, at the upper layers of silicon layers 10, and 100 nm, at the lower layers of silicon layers 10).

Figure 7:
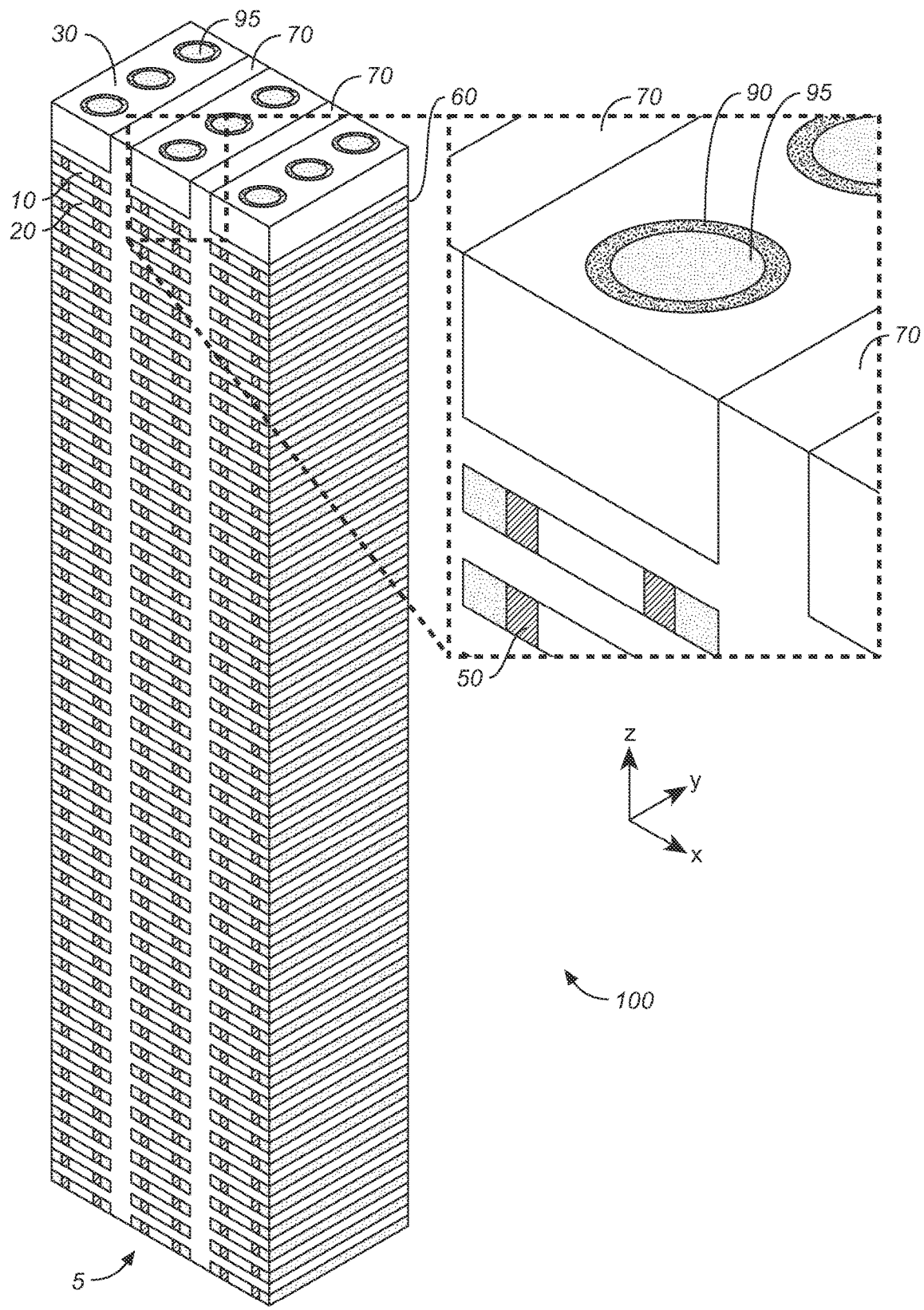
FIG. 7 shows isometric and expanded schematic views of resulting memory structure 100, after filling of vias 80 by conductive material 95, in accordance with one embodiment of the present invention.

Thereafter, charge-storage layer 90 may be conformally deposited into each of vias 80. Following deposition of charge-storage layer 90, each via may be filled by deposited conductive material 95 (e.g., a deposited titanium nitride liner, followed a deposited tungsten plug). Storage layer 90 may be a multi-layer consisting of: (i) a tunnel dielectric layer (e.g., silicon oxide), (ii) a charge-trapping layer (e.g., silicon nitride), and (iii) a blocking dielectric layer (e.g., a bi-layer of silicon oxide and aluminum oxide). Conductive material 95 in each via provides a local gate electrode, which is common to all storage transistors along the via. FIG. 7 shows isometric and expanded schematic views of resulting memory structure 100, after vias 80 is filled by conductive material 95, in accordance with one embodiment of the present invention. Storage layer 90 and conductive material 95 may each be deposited using any appropriate technique (e.g., LPCVD, ALD, CVD, or PECVD).

Figure 8:
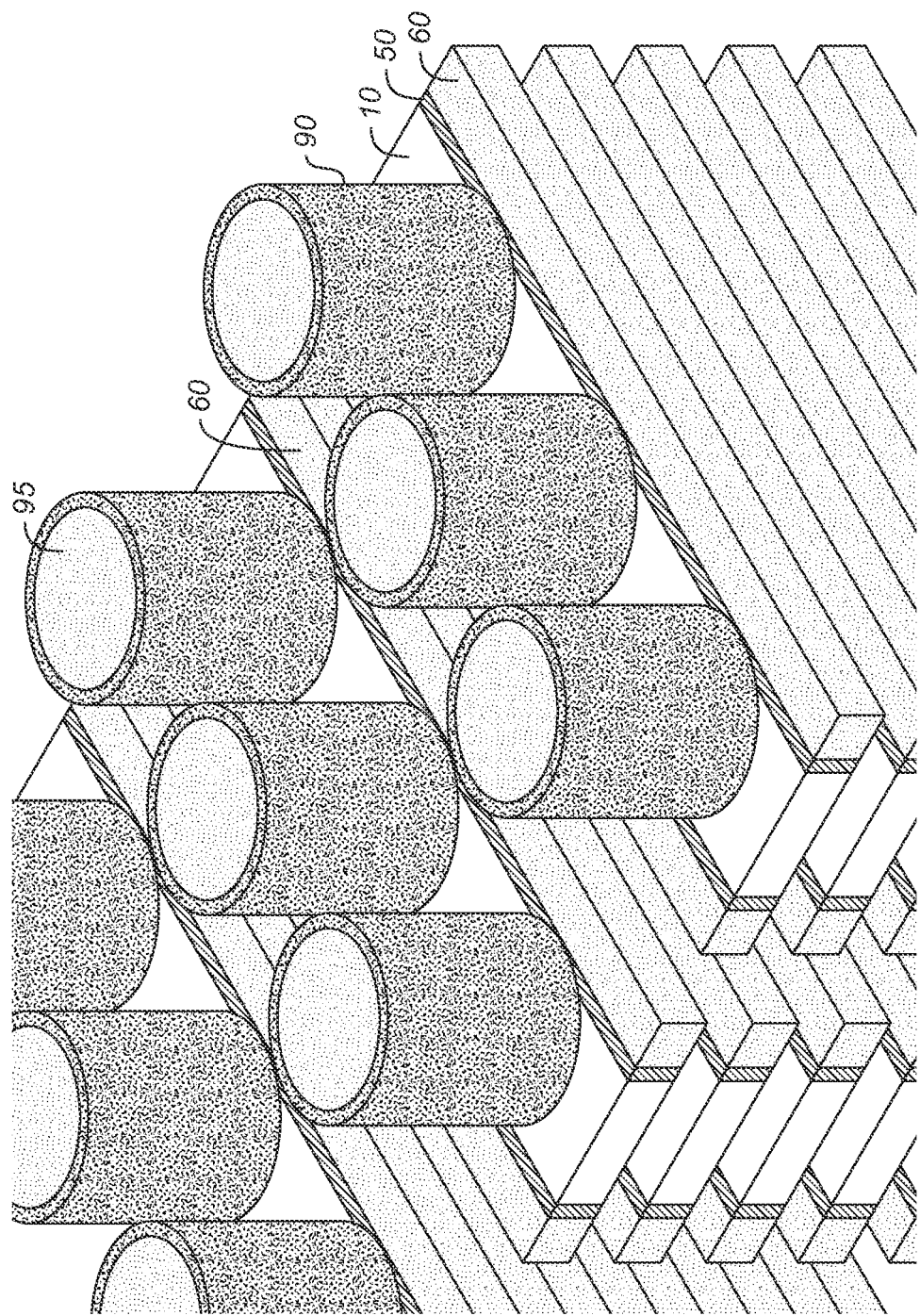
FIG. 8 shows a portion of resulting memory structure 100 with the passivation layer and dielectric layers 20 removed, so as to illustrate the device structures of the thin-film storage transistors in the 3-D NOR memory arrays, in accordance with one embodiment of the present invention.

Hard mask 30 may then be removed and replaced by a passivation layer. FIG. 8 shows a portion of resulting memory structure 100 with the passivation layer and dielectric layers 20 removed, so as to illustrate the device structures of the thin-film storage transistors in the 3-D NOR memory arrays. As shown in FIG. 8, in each of silicon layers 10, a portion is bounded on opposite sides by an adjacent pair of lines from heavily-doped silicon 50 (e.g., n$^+$-doped). When the transistor is conducting, charge carriers travel between source line and the bit line through channel region 10. The lines of heavily-doped silicon material 50 provide a common bit line and a common source line for the thin-film storage transistors of a NOR memory string extending along the Y-direction. As silicon layers 10 are lightly doped silicon (e.g., p$^-$-doped silicon), that portion of each layer of silicon layers 10 bounded by heavily-doped silicon material 50 provides the channel regions of the thin-film storage transistors in the NOR memory string. In addition, silicon layers 10 surround filled vias 80, such that conformal charge-storage layer 90 and conductive material 95 (e.g, a TiN liner surrounding a W plug) within the filled via provide a charge-storage layer and a gate electrode, respectively, for all the thin-film storage transistors formed along the filled via. Acting as shunts, conductive material 60 reduces resistivity in the common source line and the common bit line. In one embodiment, with a nominal 120-nm diameter via at the 160-nm pitch, each thin-film storage transistor may have a channel length of 100 nm, a minimum channel width of 40 nm and a thickness of 30 nm. Relative to the thin-film storage transistors of the 3-D NOR memory array disclosed in the Structural References, the thin-film storage transistors in the NOR memory arrays of the present invention have thicker and wider channel regions, which enable higher "on" currents. A higher "on" current is beneficial for faster read operations.

As shown in FIG. 8, the channel region of each thin-film storage transistor is substantially horizontal (i.e., parallel to the planar surface of semiconductor substrate 5) and its corresponding gate electrode ("local word line") is the vertical conductor in the adjacent one of vias 80. In this embodiment, as shown in FIG. 8, each thin-film storage transistor has two semi-annular charge-storage sections in charge storage layer 90 surrounding its local word line. By providing two semi-annular storage sections to each thin-film storage transistor, variations in the threshold voltages (Vt) among the thin-film storage transistors of the 3-D NOR memory array is reduced, as the two semi-annular sections both increase its total charge stored and average any shift in the thin-film storage transistor's threshold voltage. The greater charge storage capacity in charge-storage layer 90 also reduces threshold voltage variations.

To route word line signals to the local word lines (e.g., between voltage sources formed in the semiconductor substrate and the local word lines), a set of global word lines may be provided either above or below memory structure 100. (Of course, providing global word lines both above and below the 3-D NOR memory array provides even greater flexibility at a higher cost in terms of additional masking and processing steps.) When the global word lines are formed above the 3-D NOR memory arrays, a temperature-sensitive conductor (e.g., copper) that has a lower resistivity may be selected for the global word lines. Such a material may be selected because global word lines above memory structure 100 does not experience the high temperature cycles during fabrication of underlying memory structure 100. In contrast, when global word lines are formed beneath memory structure 100, a more temperature-tolerant material (e.g., tungsten) would have to selected to avoid any deleterious effect from the temperature cycles. (Tungsten, of course, is known to have a higher resistivity than copper.) Furthermore, global word lines formed above memory structure 100 often may be formed with fewer process steps than if the global word lines are formed beneath the 3-D NOR memory array.

Relative to the processes in the Related Applications, the types of etching steps required steps for processes of the present invention are fewer. In the embodiments described above, etching is required only for silicon layers 10, heavily-doped silicon material 50, conductive material 60, and dielectric layers 20. For example, forming trenches 40 and vias 80 involve only etching of silicon layers 10 and dielectric layers 20. In some of the process steps disclosed in the Related applications, for example, forming similar trenches or vias may involve the complexity of etching steps four or more materials.

Figure 9:
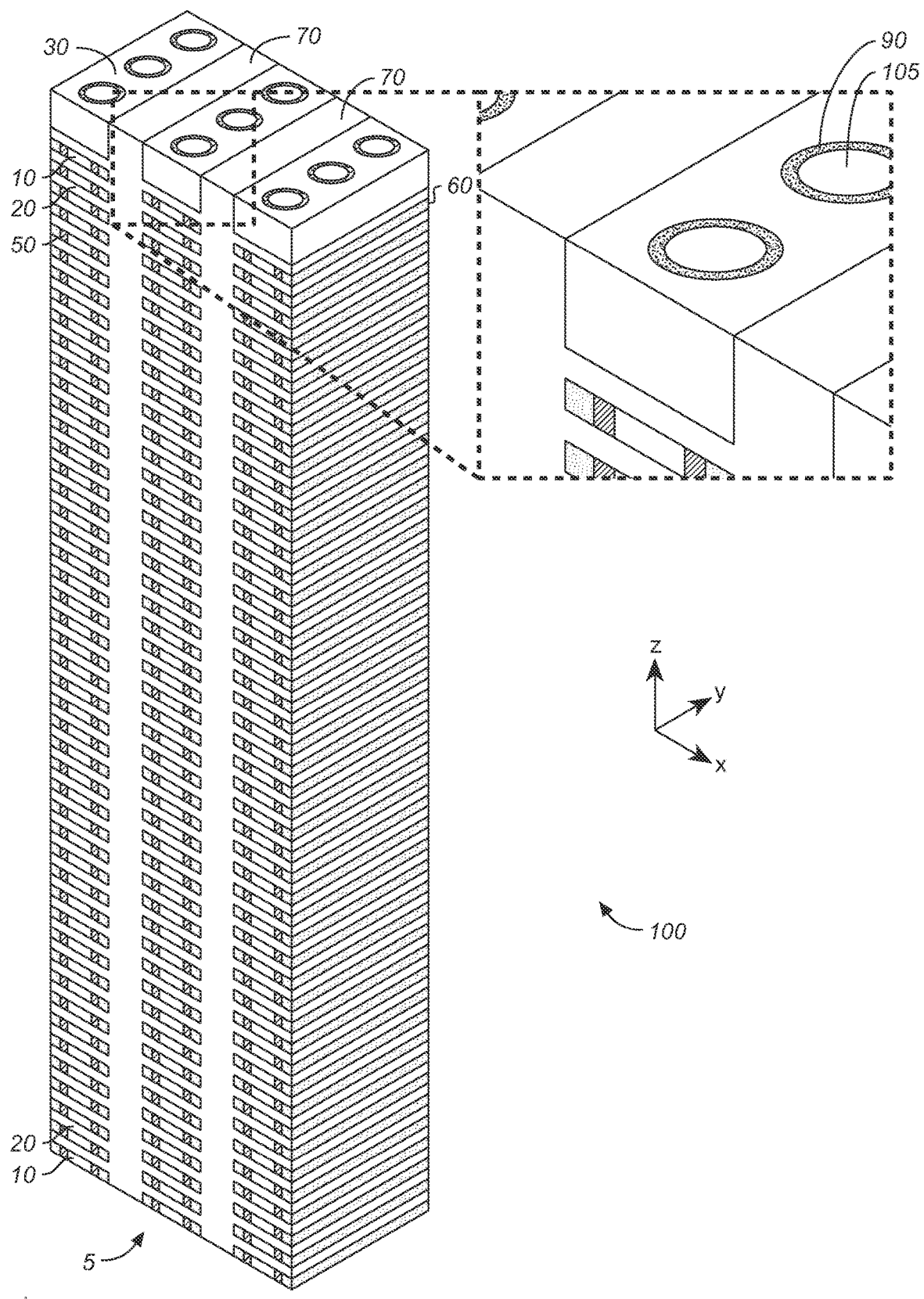
FIG. 9 shows isometric and expanded schematic views of resulting memory structure 100, after depositing charge storage layer 90 in vias 80 of FIG. 6 and filling such vias by sacrificial material 105, in accordance with one embodiment of the present invention.

In some embodiments, greater storage density may be achieved by designating each of the two semi-annular sections of charge storage layer 90 a portion of a different thin-film storage transistor. According to this approach, following the deposition of charge storage layer 90, rather than filling vias 80 with conductive material 95 (e.g., as shown in FIG. 7 above), sacrificial material 105 (e.g., silicon oxide ($SiO_2$)) may be deposited instead. FIG. 9 shows isometric and expanded schematic views of resulting memory structure 100, after depositing charge storage layer 90 in vias 80 of FIG. 6 and filling the vias by sacrificial material 105, in accordance with one embodiment of the present invention.

Figure 10:
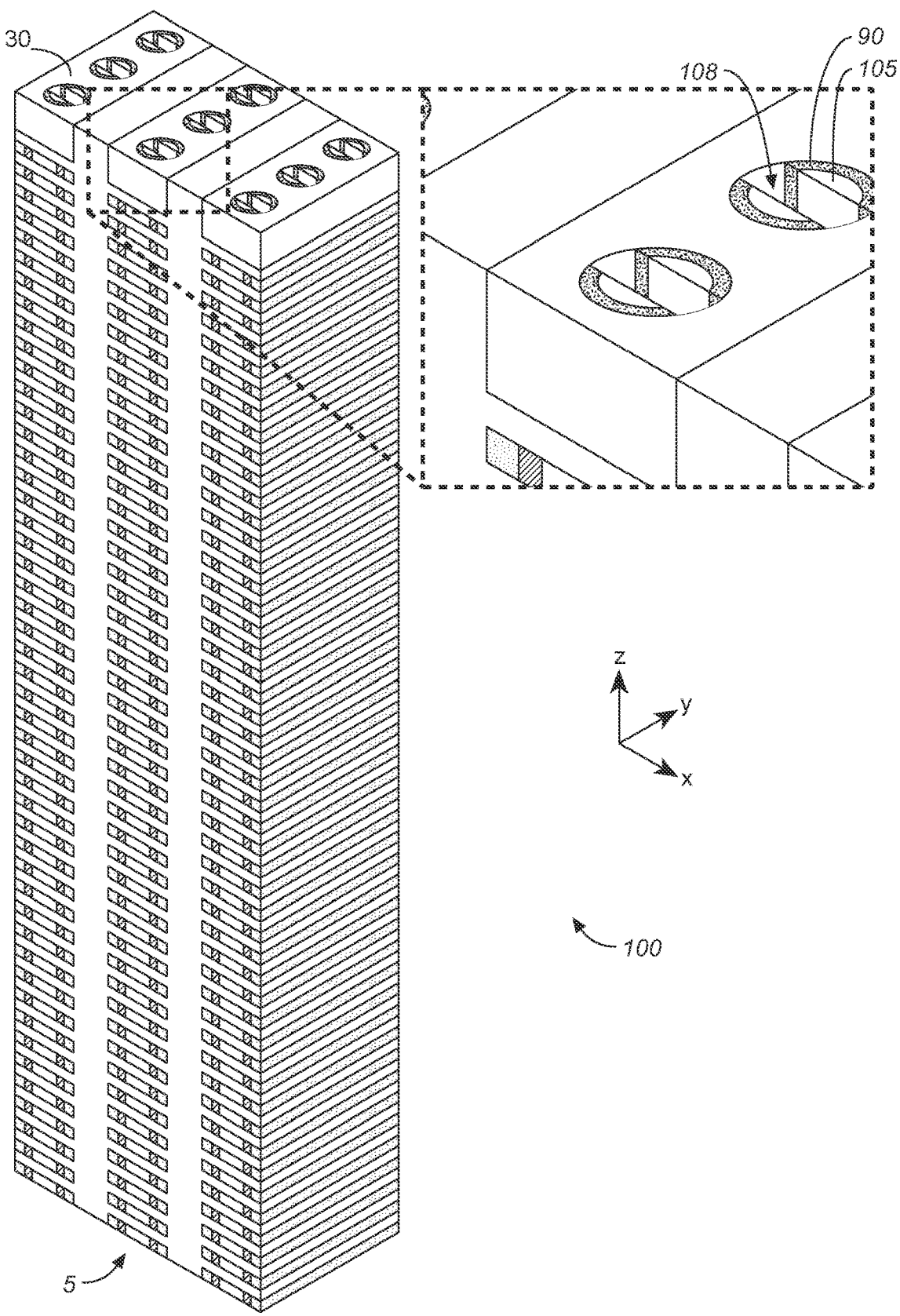
FIG. 10 shows isometric and expanded schematic views of resulting memory structure 100, after slit 108 is formed by excavating sacrificial material 105, in accordance with one embodiment of the present invention.

Thereafter, slit 108 (e.g., 40 nm×120 nm) are patterned and etched in each via to remove a portion of sacrificial material 105. using an anisotropic etch (e.g., a fluorocarbon gas and hydrogen), and then to remove a portion of charge storage layer 90 (e.g., a hot phosphoric acid ($H_3PO_4$)). Significant portions of charge storage layer may remain in each semi-annular section. The charge-storage layer etch need not remove the component tunnel dielectric layer. FIG. 10 shows isometric and expanded schematic views of resulting memory structure 100, after slit 108 is formed by excavating sacrificial material 105 from slits 108, in accordance with one embodiment of the present invention.

Figure 11:
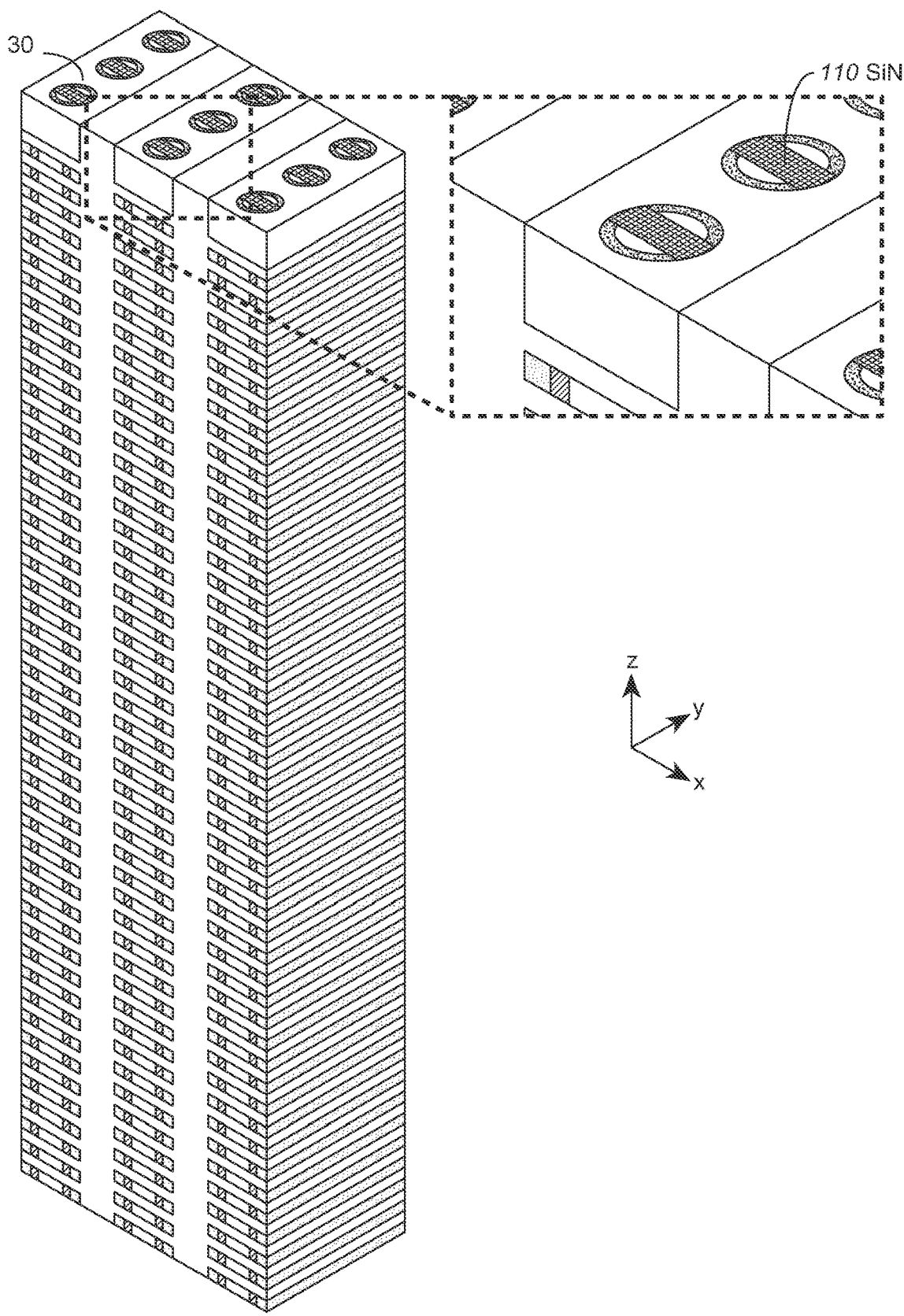
FIG. 11 shows isometric and expanded schematic views of resulting memory structure 100, after slit 108 is filled by dielectric material 110 and planarized, in accordance with one embodiment of the present invention.

Slit 108 may then be filled by dielectric material 110 (e.g., silicon nitride (SiN)), which is preferably a material that has different etching characteristics than sacrificial material 105. FIG. 11 shows isometric and expanded schematic views of resulting memory structure 100, after slit 108 is filled by dielectric material 110 and planarized, in accordance with one embodiment of the present invention.

Figure 12:
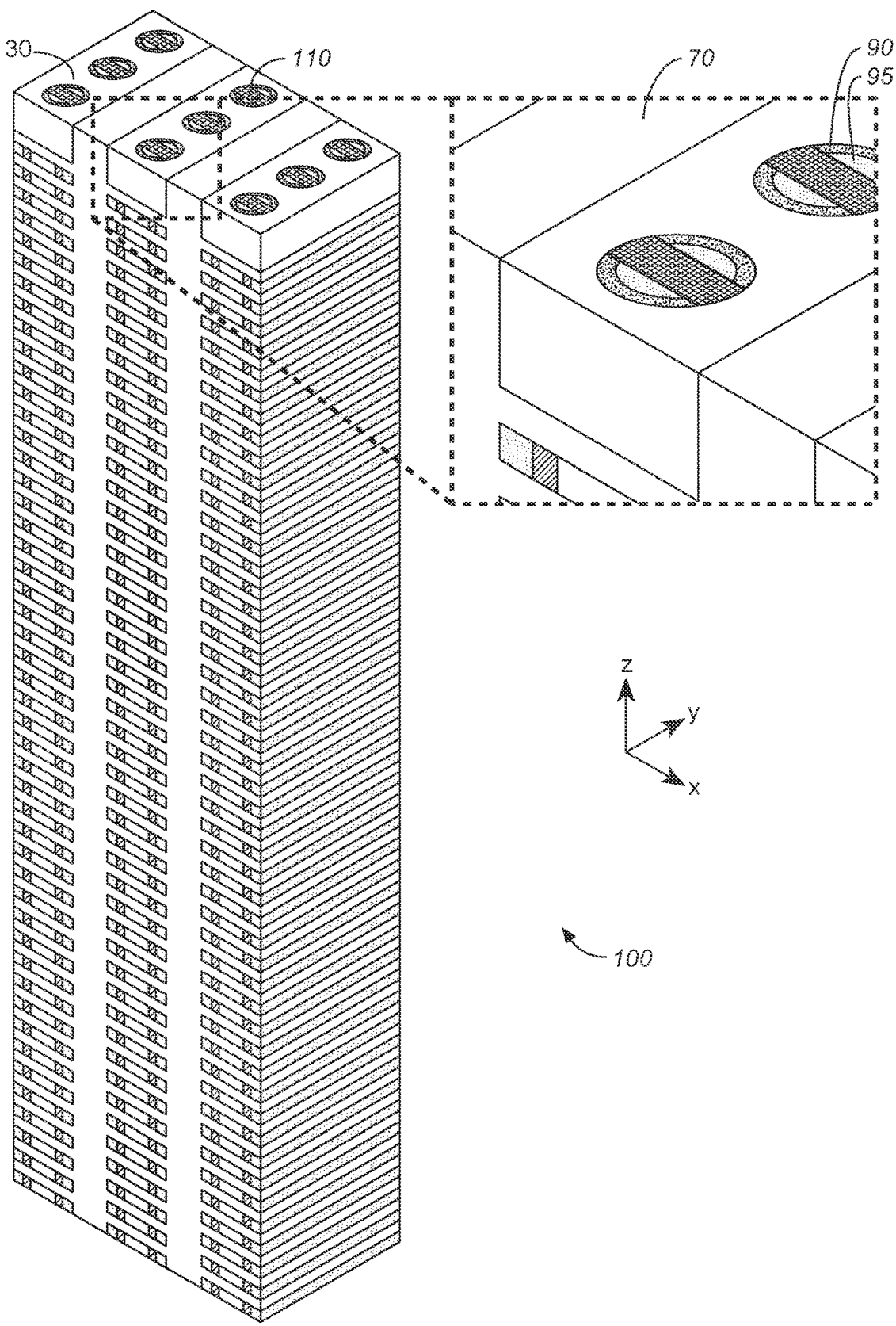
FIG. 12 shows isometric and expanded schematic views of resulting memory structure 100, after the remaining sacrificial material 105 is replaced by conductive material 95, in accordance with one embodiment of the present invention.

The remaining sacrificial material 105 may then be removed from each via using, for example, a wet etch (e.g., hydrofluoric acid (HF)) and replaced by a deposition of conductive material 95. FIG. 12 shows isometric and expanded schematic views of resulting memory structure 100, after the remaining sacrificial material 105 is replaced by conductive material 95, in accordance with one embodiment of the present invention. Hard mask 30 may then be removed and a passivation layer may be deposited on top of memory structure 100.

Figure 13:
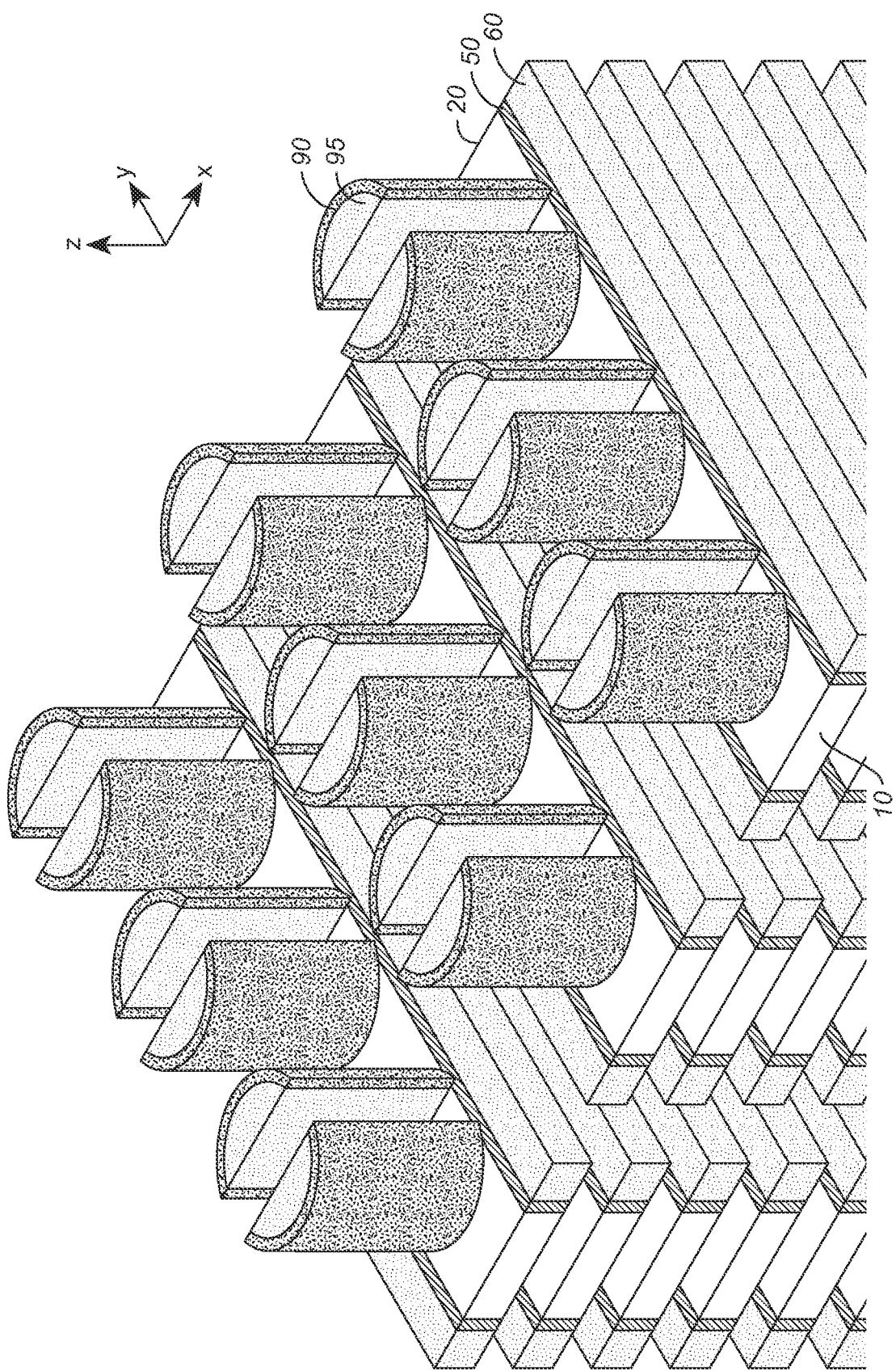
FIG. 13 shows a portion of resulting memory structure 100 with the passivation layer and dielectric layers 20 and 110 are removed, so as to illustrate the device structures of the thin-film storage transistors in the 3-D NOR memory arrays.

FIG. 13 shows a portion of resulting memory structure 100 with the passivation layer and dielectric layers 20 and 110 removed, so as to illustrate the device structures of the thin-film storage transistors in the 3-D NOR memory arrays. As shown in FIG. 13, the thin-film transistor with the two semi-annular sections in charge storage layer 90 is now divided into two independent thin-film storage transistors, each with one of the two semi-annular sections for charge storage.

2. Forming Common Source Line and Common Bit Line after Forming Local Word Lines; First Option:

In the embodiments described above, heavily-doped silicon material 50—which forms the common source line and the common bit line of the thin-film storage transistors in a NOR memory string of the 3-D NOR memory array—are deposited in memory structure 100 prior to the subsequent process steps for local word line formation (e.g., process steps described in conjunction with FIGS. 6-7 or FIGS. 9-12). As the process steps for local word line formation may require a relatively high temperature, heavily-doped silicon material 50 may be restricted to use dopants of low diffusivity (e.g., arsenic) to avoid dopant diffusion into other layers (e.g., silicon layers 10). However, this restriction may be relaxed in processes according to other embodiments of the present invention in which heavy-doped silicon material 50 (i.e., the common source line and the common bit line) are deposited after local word lines formation.

Figure 14:
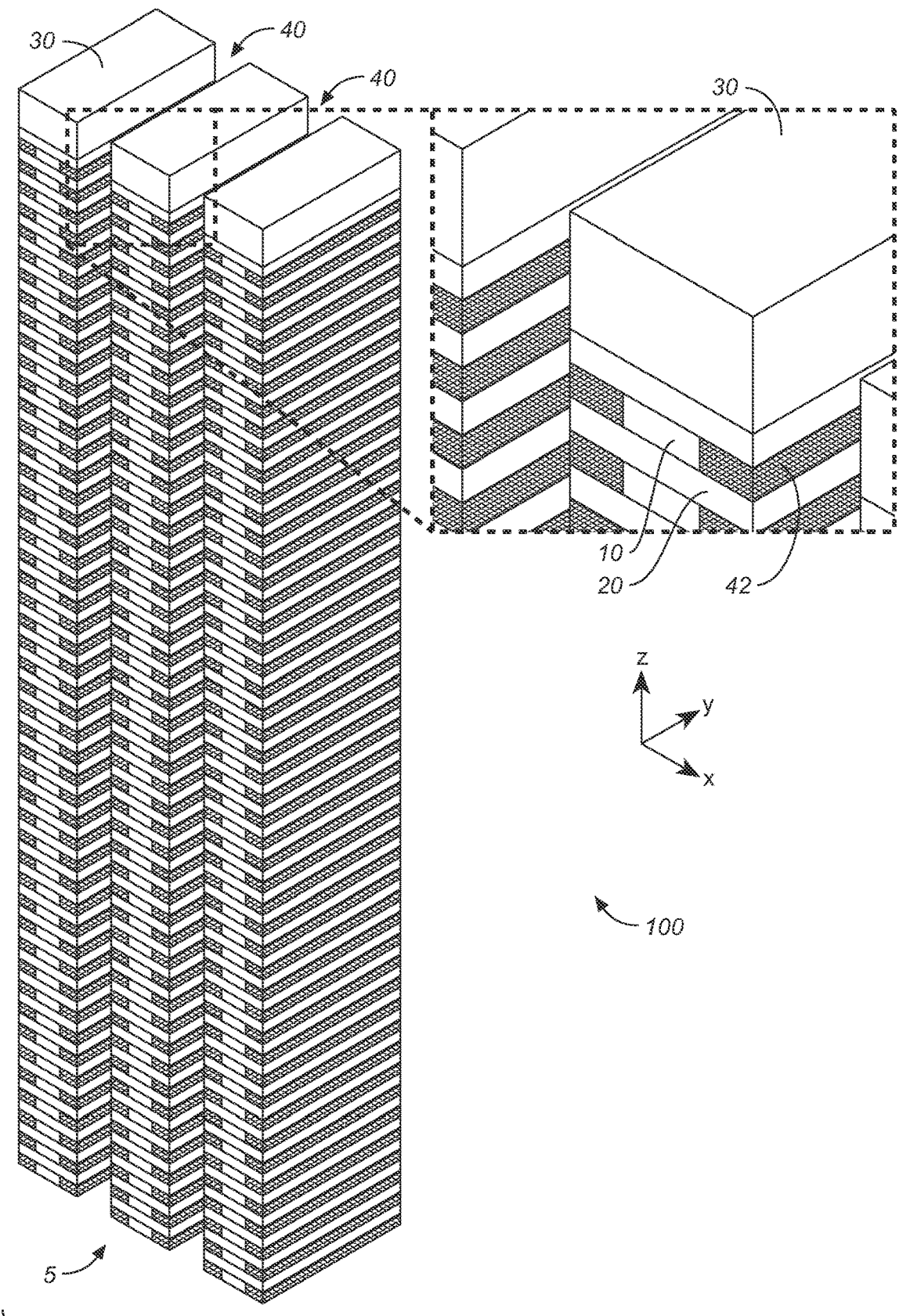
FIG. 14 shows isometric and expanded schematic views of resulting memory structure 100, after cavities in trench 40 are filled by sacrificial material 42 and removal by anisotropically etch from the sidewalls of trenches 40, instead of deposition of heavily-doped silicon material 50 (e.g., as described in conjunction with FIG. 3), in accordance with one embodiment of the present invention.

Processes that deposit heavy-doped silicon material 50 subsequent to local word line formation avoid dopant diffusion from heavily-doped silicon material 50 into at other layers (e.g., silicon layers 10) during the elevated temperatures used in fabricating the local word lines. The reduced risk of dopant diffusion allows for narrower common bit lines and common source lines, and allows dopants of higher diffusivity (e.g., phosphorus) to be used. According to one embodiment of the present invention under this alternative approach, instead of depositing heavily-doped silicon material 50 and conductive material 60, as described in conjunction with FIGS. 3-4 above, sacrificial material 42 (e.g., LPCVD silicon nitride (SiN)) is deposited instead to fill the cavities created by recessing silicon layers 10. FIG. 14 shows isometric and expanded schematic views of resulting memory structure 100, after cavities in trench 40 are filled by sacrificial material 42 and anisotropically removed from the sidewalls of trenches 40, in accordance with one embodiment of the present invention.

Figure 15:
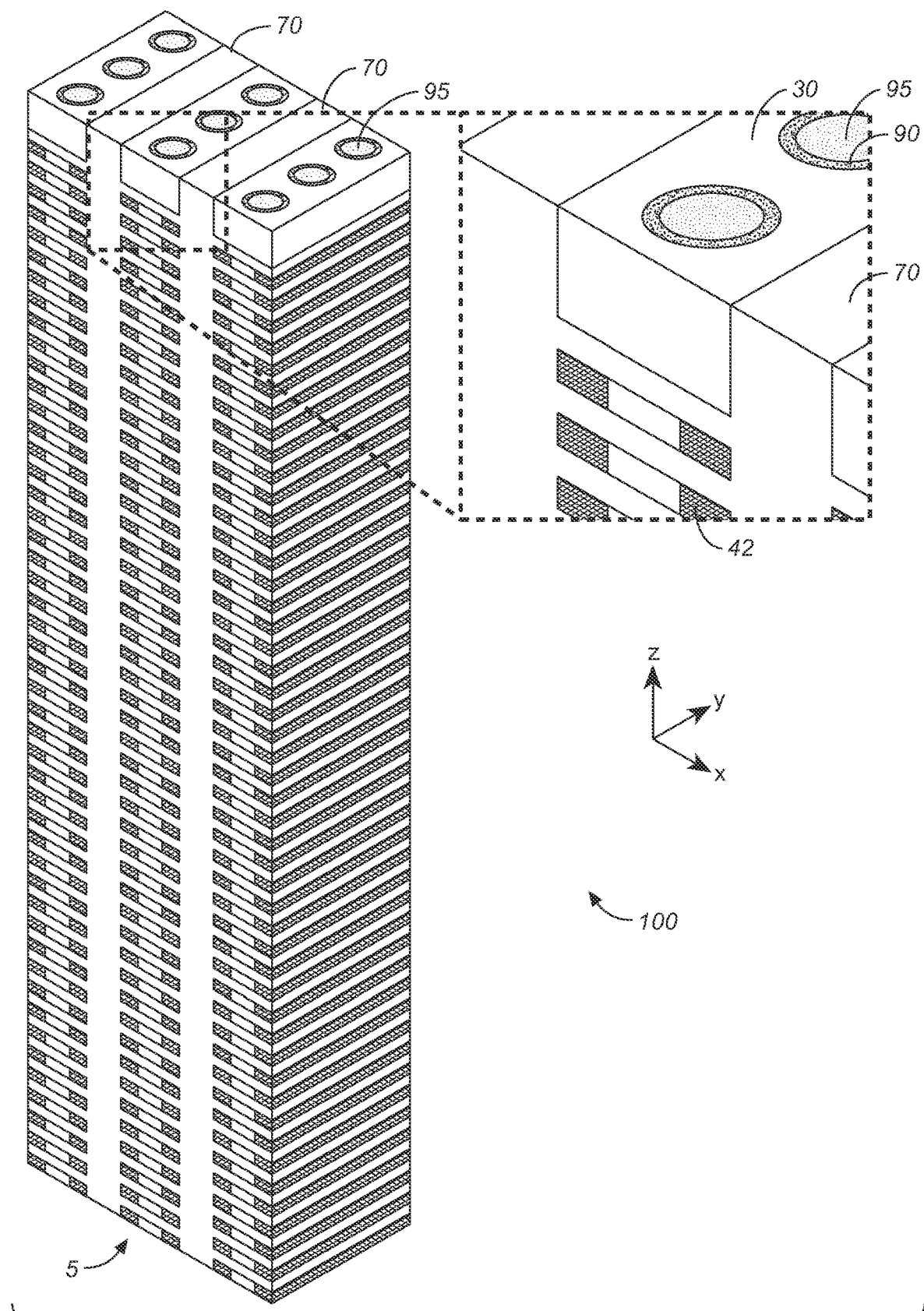
FIG. 15 shows isometric and expanded schematic views of resulting memory structure 100, after vias 80 are filled by conductive material 95 and planarized or etched-back, in accordance with one embodiment of the present invention.

The subsequent process steps carry out: (i) filling trenches 40 with dielectric material 70 (e.g., silicon oxide) and (ii) forming the local word lines in substantially the same manner as described above in conjunction with FIGS. 5-7. FIG. 15 shows isometric and expanded schematic views of resulting memory structure 100, after vias 80 are filled by charge storage layer 90 and conductive material 95, and planarized or etched-back, in accordance with one embodiment of the present invention. Under this approach, as heavily-doped silicon material 50 for forming the common source line and the common bit line is not present during the elevated temperature process steps in local word line formation, the concern regarding dopant diffusion into silicon layers 10 is alleviated. Furthermore, as in the embodiments discussed earlier, higher density thin-film storage transistors may be achieved using the techniques illustrated in conjunction with FIGS. 9-13 in which each thin-film storage transistor has a single semi-annular charge-storage region.

Figure 16:
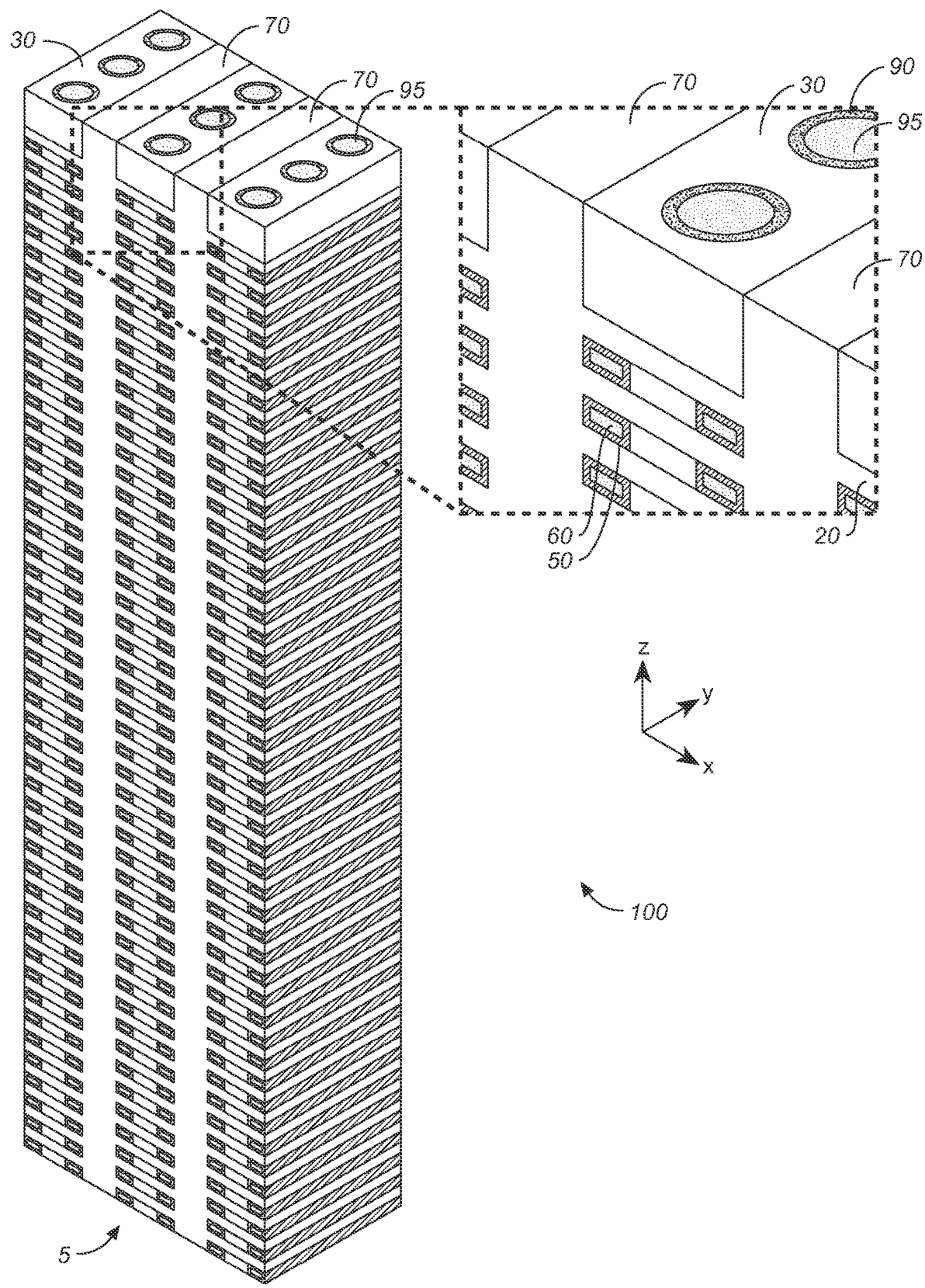
FIG. 16 shows isometric and expanded schematic views of resulting memory structure 100, after heavily-doped silicon material 50 and conductive material 60 are deposited to replace sacrificial layer 42, in accordance with one embodiment of the present invention.

After forming the local word line, one or more slits (not shown) may be anisotropically etched in memory structure 100, each slit extending along the X-direction, cutting through every layer of sacrificial material 42 in order to provide access to sacrificial material 42. Alternatively, the slits may be cut in trenches 40 by removing dielectric material 70. Accessing from the slits, sacrificial layer 42 may be removed using a selective etch (e.g., hot phosphoric acid ($H_3PO_4$)). Hot phosphoric acid etches silicon nitride at a significantly higher than rate than either silicon or silicon. Thereafter, heavily-doped silicon material 50 may be conformally deposited to line the cavities vacated by sacrificial layer 42's removal. Conductive layer 60 may then be deposited to provide the common source line and the common bit line of the thin-film storage transistors, as discussed above. Excess conductive material 60 and heavily doped silicon 50 may be removed from the slits by either a dry etch or a wet etch. The slits may then be filled with a dielectric material (not shown). FIG. 16 shows isometric and expanded schematic views of resulting memory structure 100, after heavily-doped silicon material 50 and conductive material 60 are deposited to replace sacrificial layer 42, in accordance with one embodiment of the present invention.

Hard mask 30 may then be removed and a passivation layer may be deposited on top of memory structure 100.

Because heavily-doped silicon material 50 lines the cavities vacated by sacrificial material 42 (i.e., sacrificial material 42 is deposited on both the ceiling and the floor of the cavities), thicker silicon layers 10 may be required (e.g., 50 nm, rather than 30 nm). To maintain an aspect-ratio of 15 or less during creation of trenches 40, trenches 40 may be made wider (e.g., 80 nm, at a 260-nm pitch).

Figure 17:
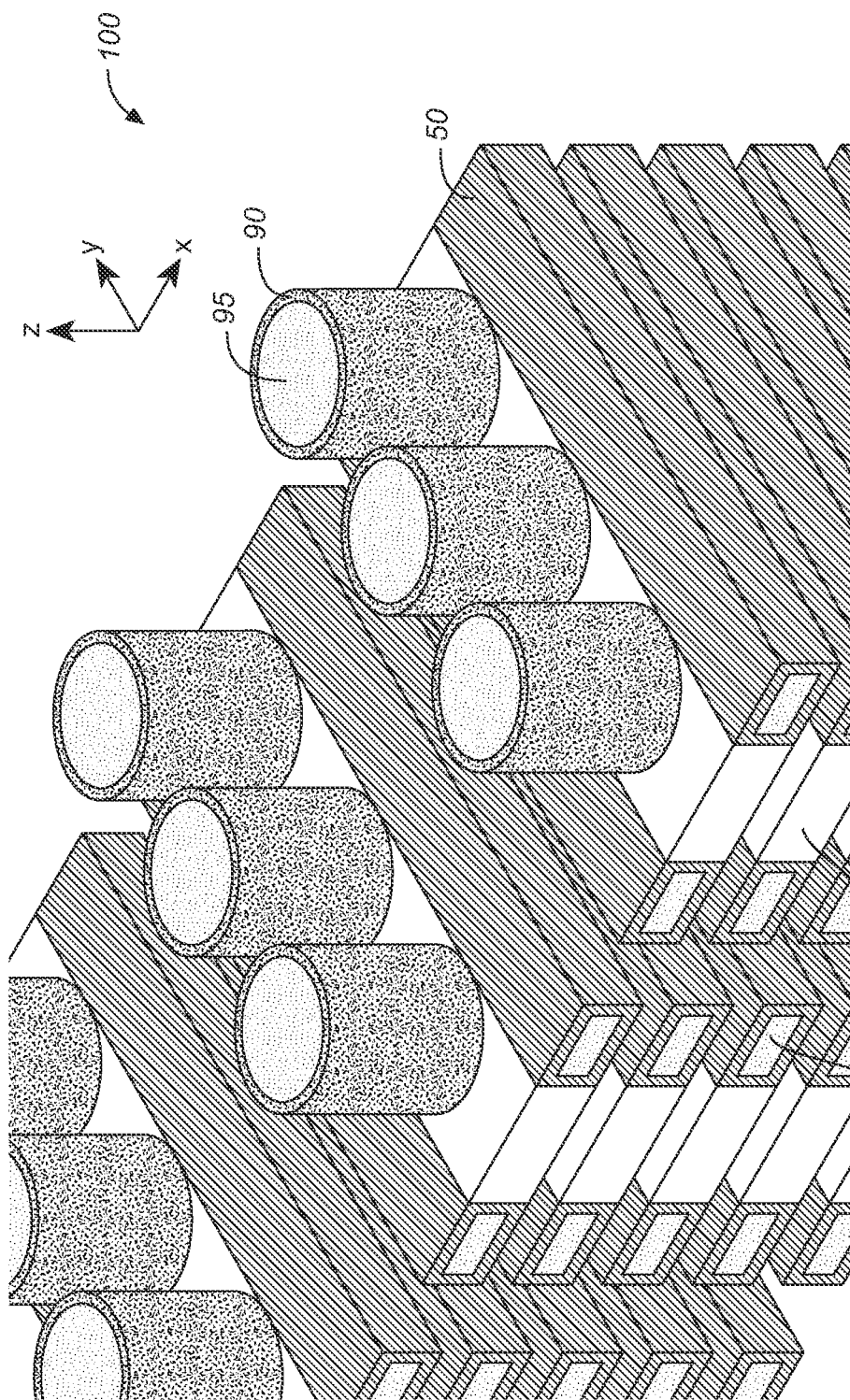
FIG. 17 shows a portion of resulting memory structure 100 with the passivation layer and dielectric layers 20 and 70 removed, so as to illustrate the device structures of the thin-film storage transistors in the 3-D NOR memory arrays.

FIG. 17 shows a portion of resulting memory structure 100 with the passivation layer and dielectric layers 20 and 70 removed, so as to illustrate the device structures of the thin-film storage transistors in the 3-D NOR memory array. As shown in FIG. 17, two annular lines of heavily-doped silicon material 50 (e.g., $n^+$-doped)—each extending in the Y-direction and surrounding a core of conductive material 60 (e.g., TiN/W)—are contacting opposite sides of a portion of silicon layers 10 (e.g., $p^-$-doped silicon). In this manner, heavily-doped silicon material 50 in each line provides either a common bit line or a common source line for the thin-film storage transistors of a NOR memory string. Acting as shunts, the enclosed core of conductive material 60 in each line reduces the resistivity of the common source line or the common bit line. The portion of silicon layer 10 provides channel region of a thin-film storage transistor. The portion of silicon layer 10 surrounds one of filled vias 80, such that charge-storage layer 90 (e.g., multi-layer of silicon oxide-silicon nitride-silicon oxide-aluminum oxide) and conductive material 95 (e.g, TiN liner surrounding a tungsten plug) within the filled via provide the charge storage layer and the gate electrode, respectively, for the thin-film storage transistors along the length of the filled via. The device structure of the thin-film storage transistor illustrated in FIG. 17 has all the advantages of the device structure of the thin-film storage transistors illustrated in FIG. 8, in addition to other advantages.

3. Forming Local Word Lines Prior to Forming Common Source Line and Common Bit Line; Second Option:

In the embodiments described in detail above, the process sequence for forming the local word lines (e.g., as described in conjunction with described in conjunction with FIGS. 6-7) are carried out after the process sequence that (i) forms trenches 40, (ii) recesses silicon layers 10, (iii) deposits heavily-doped silicon material 50 (or, alternatively sacrificial layer 42), (iii) deposits conductive material 60, and (iv) fills trenches 40 with dielectric material 70 (e.g., as described in conjunction with FIGS. 1-5). The order of carrying out these sequences may be reversed.

As discussed above, forming the local word lines prior to providing the heavily-doped silicon material 50 (i.e., the common source line and the common bit line) avoids excessive diffusion of dopants from heavy-doped silicon material 50 during elevated temperature steps associated with local word line formation. For $n^+$-doped silicon material, one is not constrained to low-diffusivity dopants (e.g., arsenic), and may select dopants of higher diffusivity (e.g., phosphorus). In addition, conductive material 95 filling vias 80 provides mechanical support to memory structure 100 during and after formation of trenches 40. Consequently, higher aspect-ratio etching steps may be used to form trenches 40. These higher aspect-ratio etching steps allow memory structure 100 to have many more alternating layers of silicon and dielectric materials in the active stack (e.g., 96 layers, rather than 48 in one example above) and, consequently, lithographical constraints may be relaxed to allow even finer features. For example, in one embodiment, vias

80 may have a diameter of 100 nm and placed 180 nm center-to-center apart (i.e., relaxed from a 120-nm diameter, placed 240 nm apart).

After the initial steps of (i) successively and alternately depositing 48 or 96 dielectric layers (e.g., dielectric layers 20) and 48 or 96 silicon layers (e.g., silicon layers 10) on the planar surface of semiconductor substrate 5, and (ii) providing hard mask layer 30, as described above, hard mask layer 30 is patterned and etched to create vias 80. In one embodiment, the silicon layers and the dielectric layer layers are each 30-nm thick. (Of course, these values are provided purely for illustration; any suitable thickness and any suitable number of layers may be used.)

Figure 18:
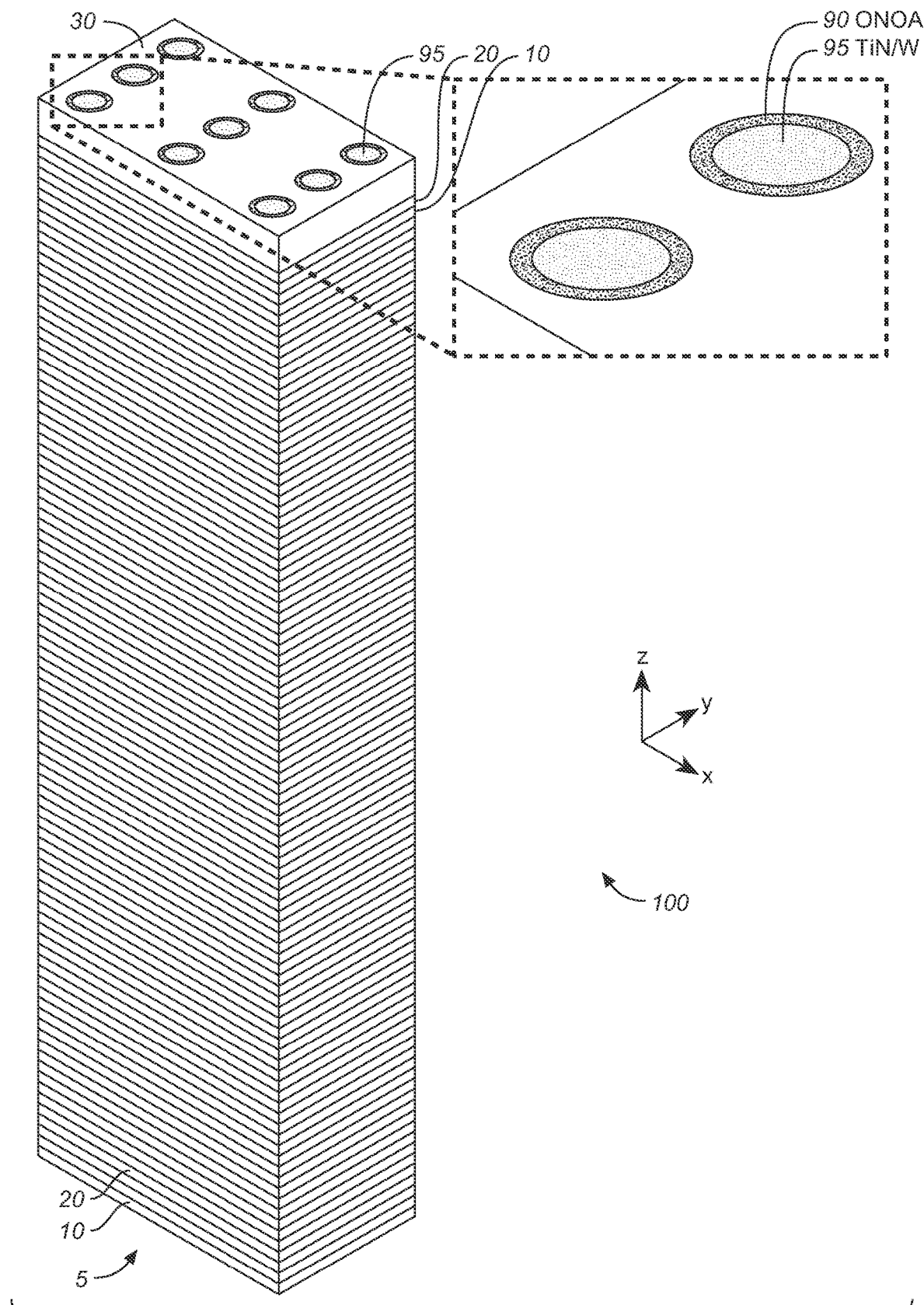
FIG. 18 shows isometric and expanded schematic views of resulting memory structure 100, after forming vias 80 and depositing charge-storage layer 90 and conductive material 95, prior to formation of trenches 40, in accordance with one embodiment of the present invention.

Thereafter, conformal deposition of charge storage layer 90 and deposition of conductive material 95 in bulk (e.g., in the form of a plug) are carried out in substantially the same manner as described above in conjunction with FIGS. 6-7. Under this approach, vias 80 may have a diameter of 100 nm, at a 140 nm pitch (center-to-center along the Y-direction). FIG. 18 shows isometric and expanded schematic views of resulting memory structure 100, after forming vias 80 and depositing conformally charge-storage layer 90, followed by depositing conductive material 95 in bulk, prior to forming trenches 40, in accordance with one embodiment of the present invention. As discussed above, even higher density thin-film storage transistors may be achieved using the techniques illustrated in conjunction with FIGS. 9-13 to provide thin-film storage transistors having charge-storage regions with single semi-annular charge-storage regions.

After the local word lines are formed, the steps of creating trenches 40, recessing silicon layers 10, providing heavily-doped silicon material 50, and providing conductive material 60 may be carried out in substantially the same manner as described above in conjunction with FIGS. 1-5. As the high temperature steps in local word line formation are carried out before heavily-doped silicon material 50 is deposited, there is no need to use sacrificial layer 42 to stand-in for heavily-doped silicon material 50.

Figure 19:
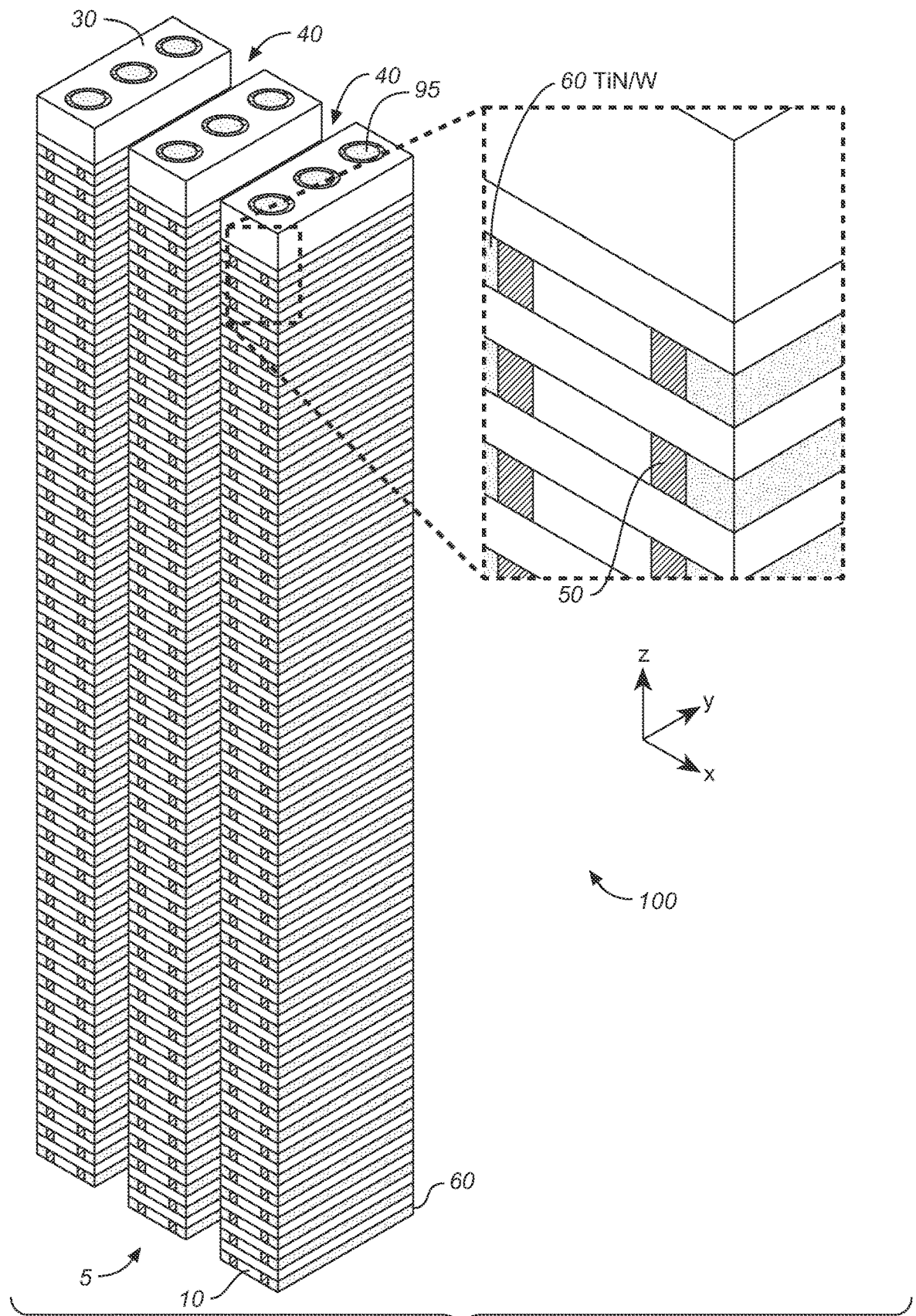
FIG. 19 shows isometric and expanded schematic views of resulting memory structure 100, after formation of trenches 40 and depositions of heavily-doped silicon material 50 and conductive material 60, in accordance with one embodiment of the present invention.

Because of greater mechanical stability is achieved by having a plug of conductive material 95, e.g., tungsten, trenches 40 may be 100-nm wide along the X-direction, at a 180-nm pitch. The resulting widths (i.e., along the X-direction) for the channel region, the common bit line, and the common source line are, respectively, 50 nm, 30 nm and 30 nm. The width of conductive material 60 adjacent the common bit line or the common source line may be as little as 10 nm. FIG. 19 shows isometric and expanded schematic views of resulting memory structure 100, after formation of trenches 40 and depositions of heavily-doped silicon material 50 and conductive material 60, in accordance with one embodiment of the present invention.

Figure 20:
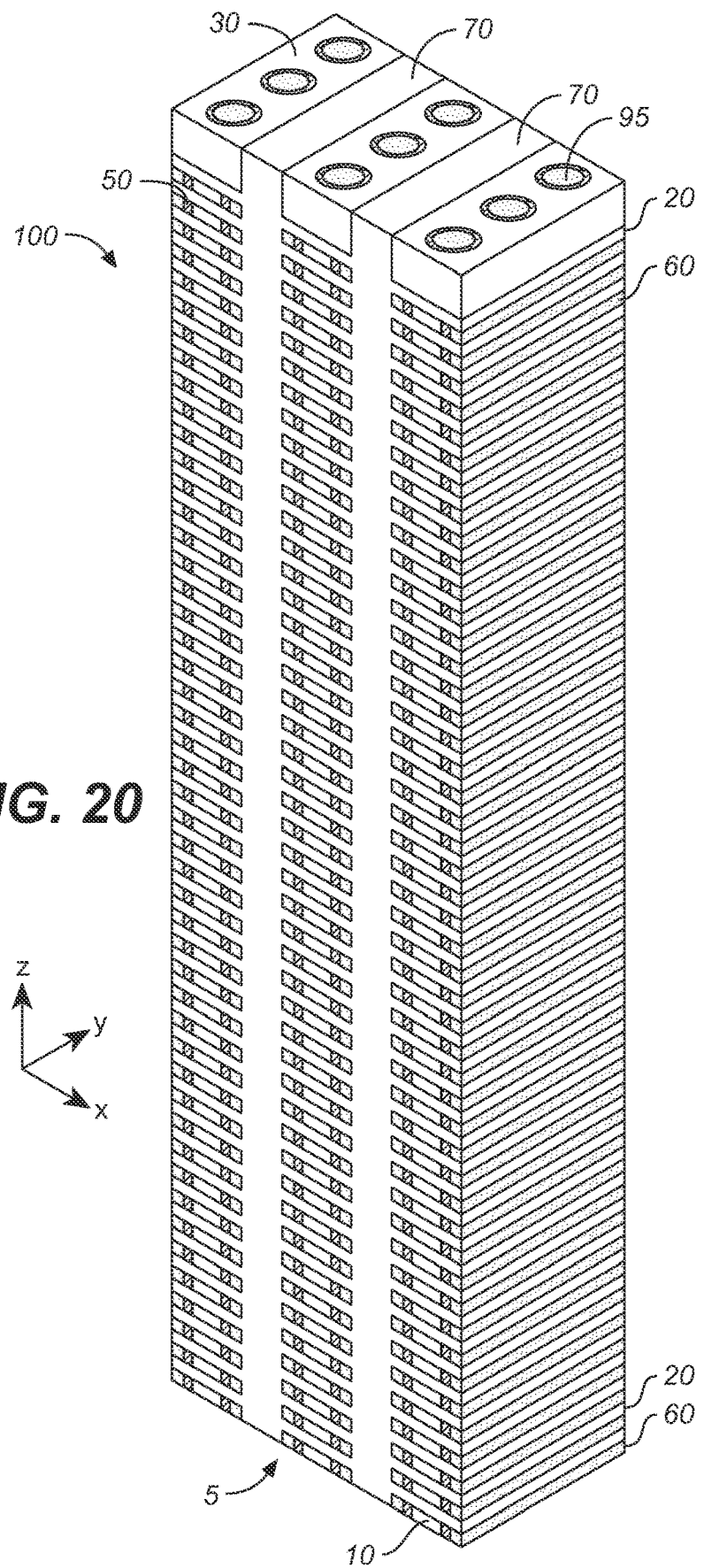
FIG. 20 shows an isometric schematic view of resulting memory structure 100, after deposition of dielectric material 70 into trenches 40, in accordance with one embodiment of the present invention.

Trenches 40 may then be filled using dielectric material 70 described above. FIG. 20 shows resulting memory structure 100, after deposition of dielectric material 70 into trenches 40, in accordance with one embodiment of the present invention. The resulting device structure for the thin-film storage transistors of the present invention is substantially as described above in conjunction with FIG. 8.

If the number of silicon layers 10 in the active stack is 96, rather than 48, trenches 40 may be formed in two trench-etching sequences, with the trenches created in the first trench-etching sequence oxide-filled to provide mechanical support while carrying out the second trench-etching sequence. Such an approach is disclosed in some examples in the Related Applications.

4. Forming Local Word Lines Prior to Forming Common Source Line and Common Bit Line; Third Option—Recessed Charge-Trapping Layer:

In the embodiments described above, the component charge-trapping layer within charge-storage layer 90 is continuous between vertically adjacent thin-film storage transistors formed within each one of vias 80. Consequently, charge stored in a thin-film storage transistor may leak into one of its neighbor thin-film storage transistor through the charge-trapping layer. This condition may be avoided if the component charge-trapping layers of vertically adjacent thin-film storage transistors in a via are separated. This result may be achieved by providing the charge-trapping layer of a thin-film storage transistor in a recess of a channel region of the thin-film storage transistor and removing from the via any charge-trapping layer material between thin-film storage transistors.

Figure 21:
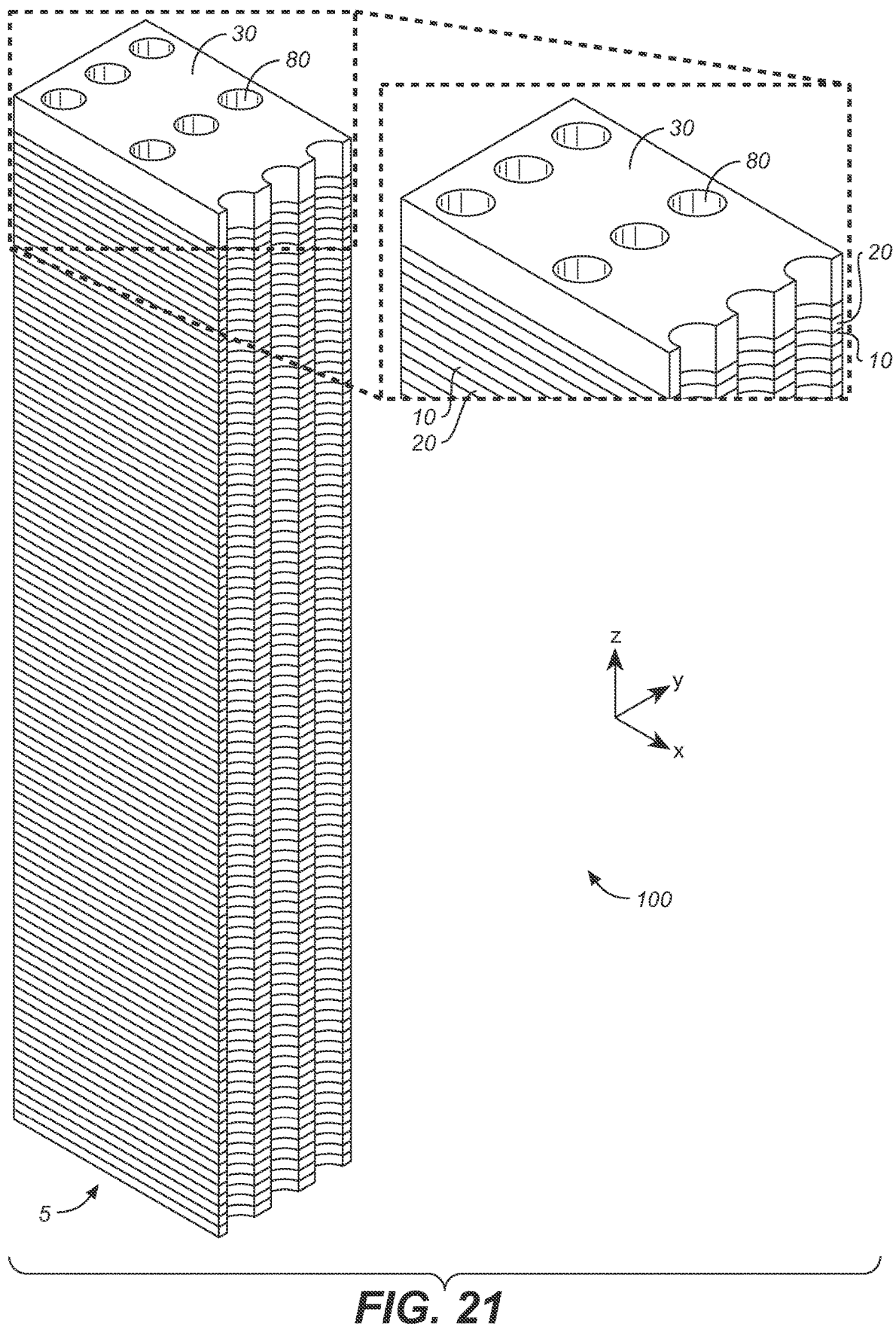
FIG. 21 shows isometric and expanded schematic views of resulting memory structure 100, after forming vias 80, in accordance with one embodiment of the present invention.

According to one embodiment of the present invention, the 96-layer active stack of alternating silicon and dielectric materials (e.g., 30-nm thick p⁻-doped silicon layers 10 and 25-nm thick dielectric layer 20), and hard mask layer 30 on top of the active stack may be prepared over a planar surface of semiconductor substrate 5 in substantially the same manner as described above. Thereafter, vias 80 (e.g., 80 nm X-Y plane diameter, at a 140-nm pitch) are etched. Vias 80 has a depth (i.e., in the Z-direction) that extends the full thickness (e.g., 2.64 μm) of the active stack. In one embodiment, 110-nm critical dimensions at the top layers and 90-nm critical dimensions at the bottom layers may be targeted. FIG. 21 shows isometric and expanded schematic views of resulting memory structure 100, after forming vias 80, in accordance with one embodiment of the present invention.

Figure 22:
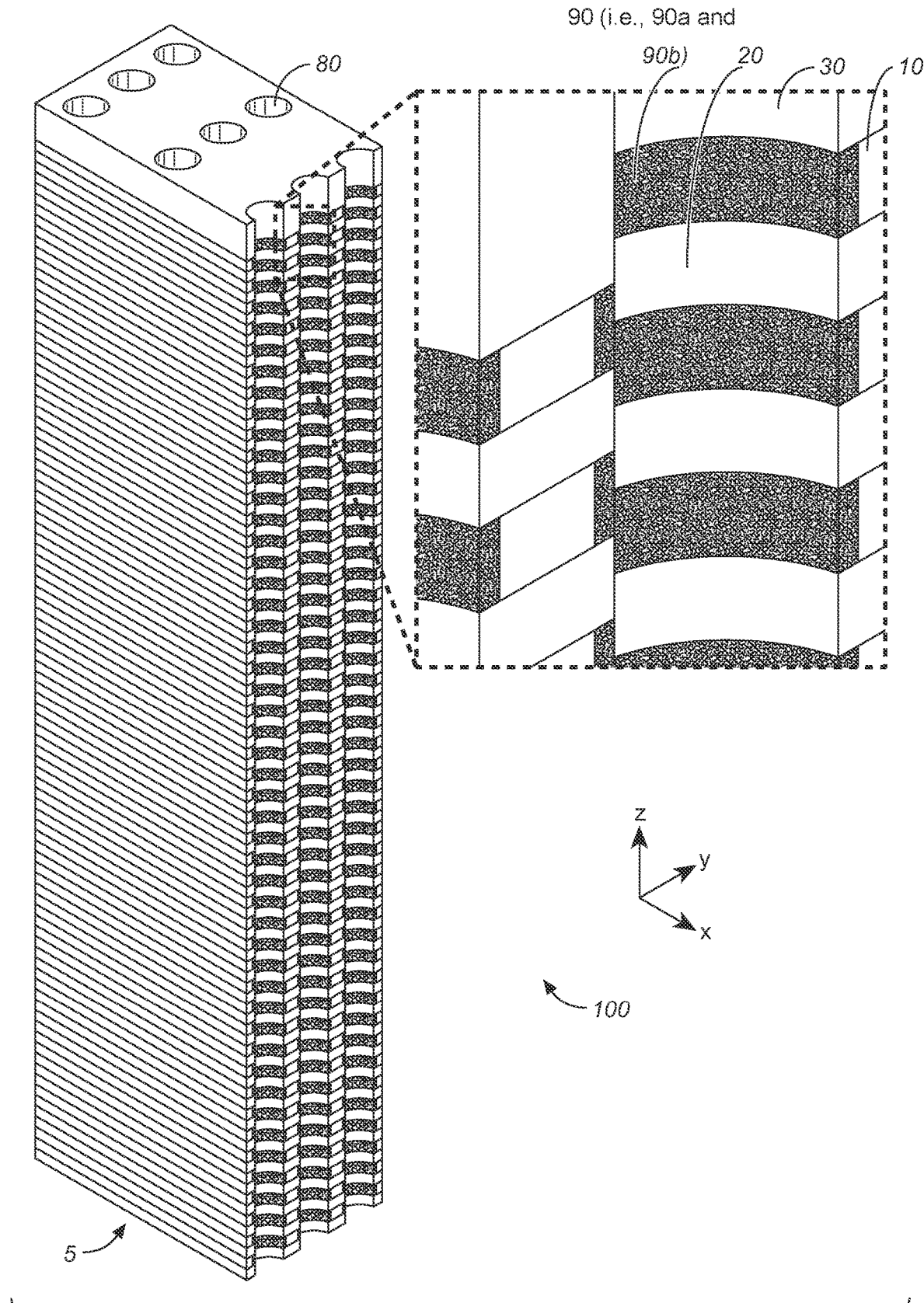
FIG. 22 shows isometric and expanded schematic views of resulting memory structure 100, after a separation etch removes at least component charge-trapping layer 90b from the sidewalls of vias 80, in accordance with one embodiment of the present invention.

An isotropic etch that is selective to dielectric layers 20 then recesses silicon layers 10 by, for example, 5 nm, although any suitable recess amount (e.g., 10 nm or 20 nm) may be used, forming ledges of dielectric layers 20 between each of silicon layers 10. Component tunnel dielectric layer 90a and charge-trapping layer 90b of charge-storage layer 90 are then successively and conformally deposited into vias 80, followed by a separation etch that removes at least deposited charge-trapping layer 90b from the sidewalls of vias 80. FIG. 22 shows isometric and expanded schematic views of resulting memory structure 100, after a separation etch removes at least component charge-trapping layer 90b from the sidewalls of vias 80, in accordance with one embodiment of the present invention.

Figure 23:
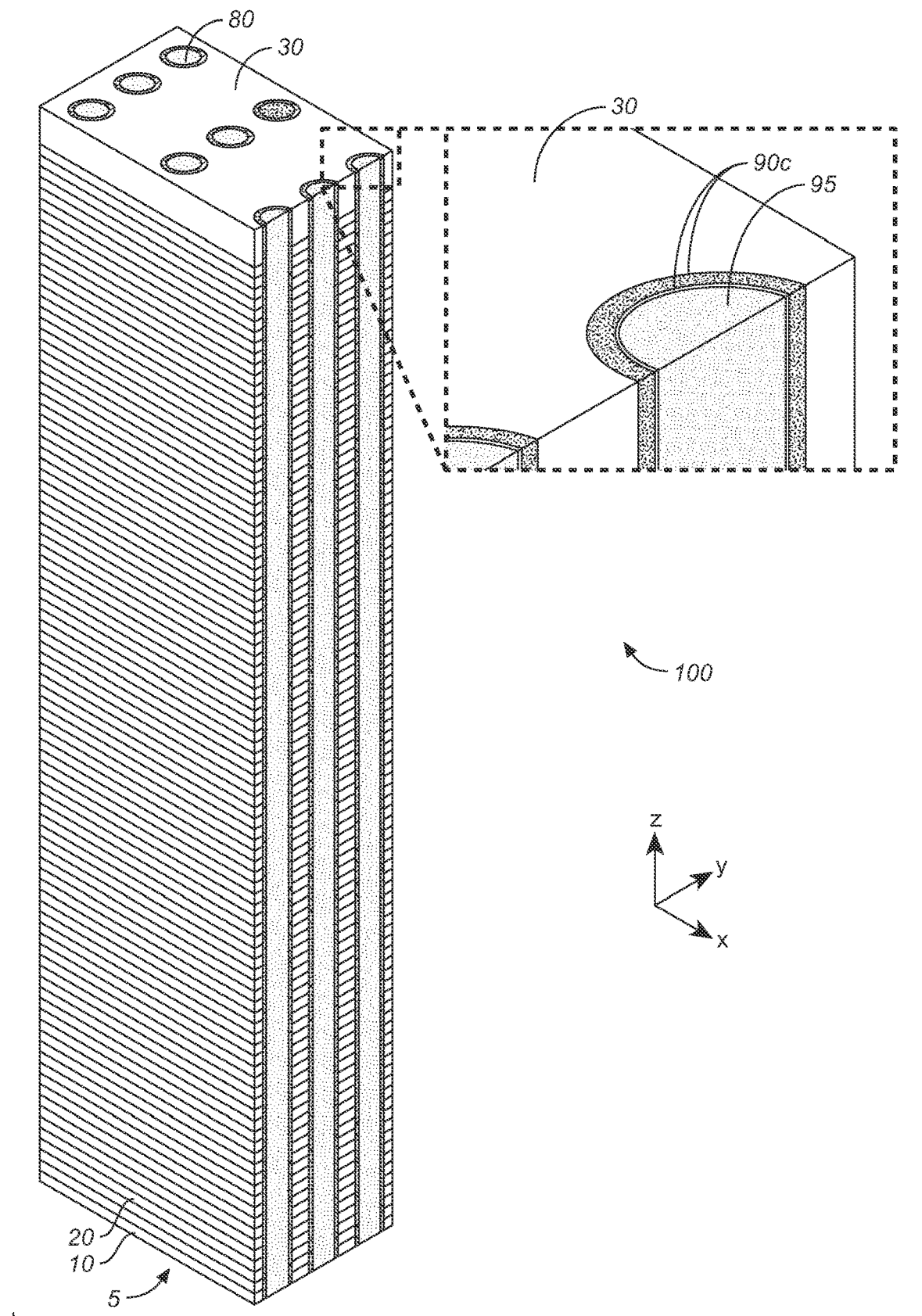
FIG. 23 shows isometric and expanded schematic views of resulting memory structure 100, after deposition of conductive material 95 to vias 80, in accordance with one embodiment of the present invention.

Component blocking dielectric layer 90c of charge-storage layer 90—consisting, for example, of a silicon oxide layer and an aluminum oxide layer—is then deposited. Conductive material 95—consisting, for example, of a titanium nitride liner surrounding a tungsten plug—fills vias 80. FIG. 23 shows isometric and expanded schematic views of resulting memory structure 100, after deposition of conductive material 95 to vias 80, in accordance with one embodiment of the present invention.

Alternatively, for even higher density thin-film storage transistors, the techniques illustrated in conjunction with FIGS. 9-13 under the single-annular charge-storage region approach may be applied.

Figure 24:
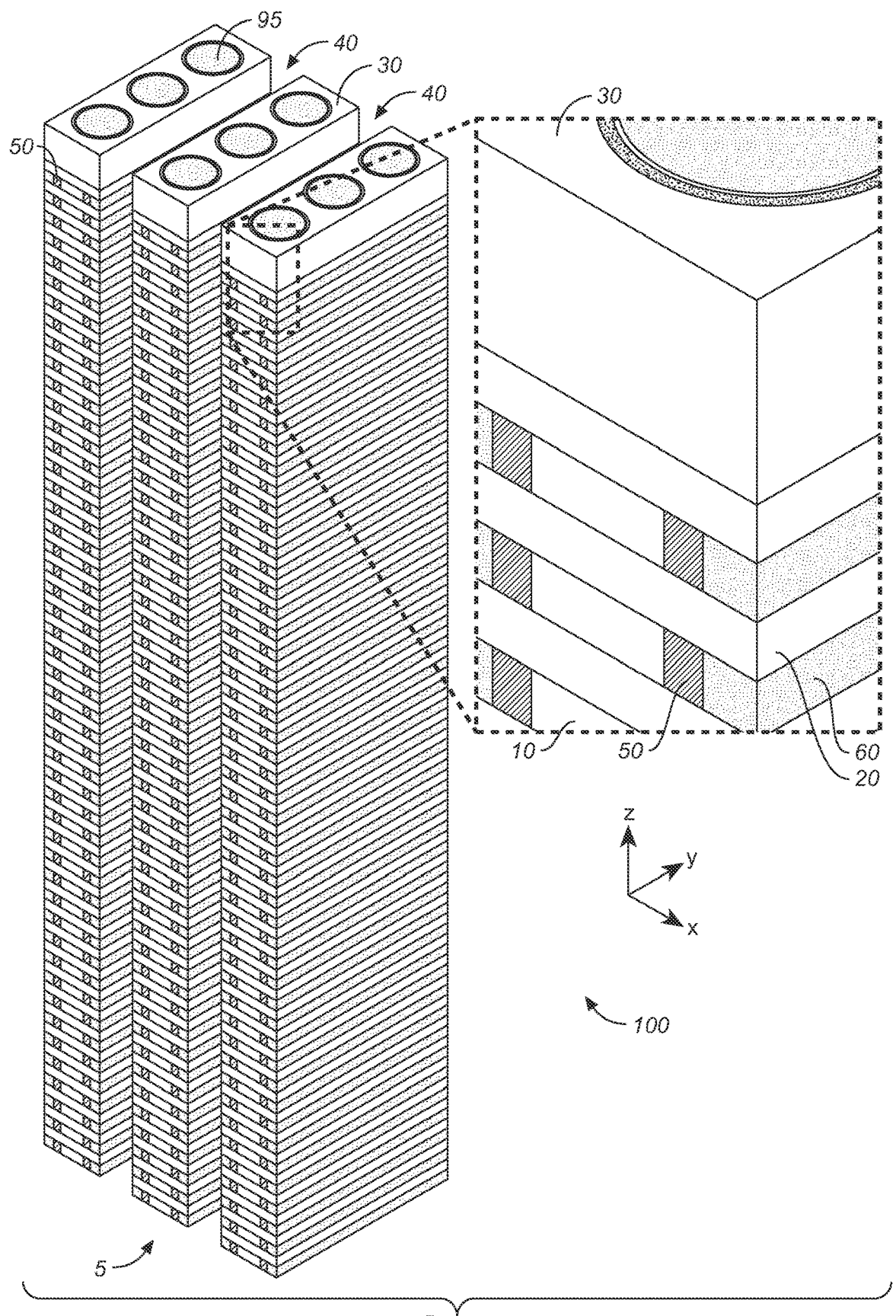
FIG. 24 shows isometric and expanded schematic views of resulting memory structure 100, after an anisotropic etch removes excess conductive material 60 from trenches 40, in accordance with one embodiment of the present invention.

Thereafter, trenches 40 may be etched. In one embodiment, trenches 40 are each 80-nm wide, cut at a 220-nm pitch, such that each active stack is 140-nm wide along the X-direction, so as to obtain an aspect ratio of less than 19.0. (With the tungsten plugs in vias 80, reliable etch with an aspect ratio of 26.0 may be achieved). Accessing from trenches 40, an isotropic etch may be used to recess silicon layers 10 by 40 nm along the X-direction on each side, such that each recessed layer of silicon layers 10 may be about 60 nm wide. Heavily-doped silicon material 50, and conductive material 60, each 20 nm wide along the X-direction, may be deposited in substantially the same manner as described above in conjunction with FIGS. 3-4. FIG. 24 shows isometric and expanded schematic views of resulting memory structure 100, after an anisotropic etch removes excess conductive material 60 from trenches 40, in accordance with one embodiment of the present invention.

Trenches 40 may then be filled by dielectric material 70, in the manner substantially as described above in conjunction with FIG. 5. Hard mask 30 may then be removed and a passivation layer may be deposited on top of memory structure 100. In one embodiment, a thin-film storage transistor has a channel length of about 86 nm and a channel width of about 30 nm.

Figure 25:
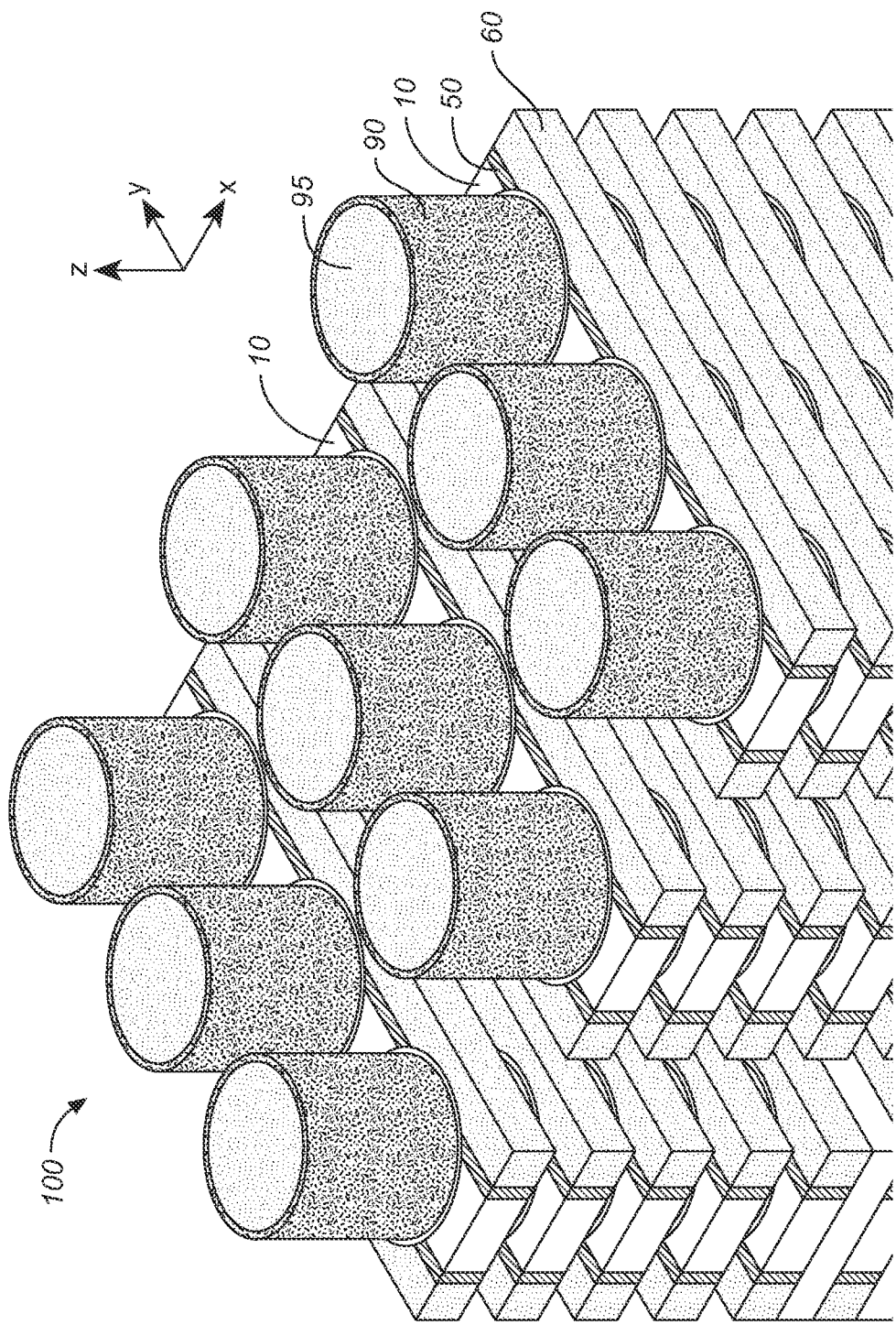
FIG. 25 shows a portion of resulting memory structure 100 of FIG. 24, with the passivation layer and dielectric layers 20 and 110 removed, so as to illustrate the device structures of the thin-film storage transistors in the 3-D NOR memory arrays.

FIG. 25 shows a portion of resulting memory structure 100 with the passivation layer and dielectric layers 20 and 110 removed, so as to illustrate the device structures of the thin-film storage transistors in the 3-D NOR memory arrays. As shown in FIG. 25, each 40-nm wide recessed layer of silicon layers 10 is bounded on opposite sides by adjacent 20-nm layers of heavily-doped silicon material 50; the recessed layer of silicon layers 10 and its bordering heavily-doped silicon material 50 providing a channel region, a common bit line and a common source line for the thin-film storage transistors of a NOR memory string. Conductive material 60 act as shunts to reduce resistivity in the common source line and the common bit line. Conformal charge-storage layer 90—with its recessed component charge-trapping layer 90*b*—and conductive material 95 (e.g, a TiN liner surrounding a tungsten plug) within the filled via provide a charge-storage layer and a local word line, respectively, for all the thin-film storage transistors formed along the filled via.

In addition to the higher charge-storage integrity due to the recessed component charge-trapping layer in the charge-storage layer, the thin-film storage transistor of FIG. 25 has the advantage of having an option to use a high-diffusivity dopant (e.g., phosphorus) in heavily-doped silicon material 50, it being deposited after formation of the local word line. The higher quality of silicon layers 10 due to crystallization by annealing at a relatively low temperature (e.g. 600° C.) enables higher "on" currents for faster read operations. Having the greater charge storage capacity in two semi-annular charge-storage sections in each thin-film storage transistor, variations in threshold voltages (Vt) among the thin-film storage transistors are reduced. The device structure of FIG. 25 is also amenable to simpler routing of the global word lines, so that the number of required masking steps is reduced relative to the NOR memory arrays disclosed in the Structural References. These global word lines may be formed above memory structure 100 to take advantage of lower resistivity material that is a feasible option only when fabricated above the memory array.

The detailed description is provided to illustrate specific embodiments of the present invention and is not intended to be limiting. Numerous variations and modifications within the scope of the present invention are possible. The present invention is set forth in the accompanying claims.

We claim:

1. A thin-film storage transistor formed above a planar surface of a semiconductor substrate, comprising:
    first and second dielectric layers, each having a planar surface that is substantially parallel to the planar surface of the semiconductor substrate, wherein the planar surfaces of the first and the second dielectric layers are separated from each other by a predetermined distance along a direction substantially normal to the planar surface of the semiconductor substrate;
    a semiconductor layer provided between the planar surfaces of the first and the second dielectric layers, having an opening therein;
    first and second conductive layers, located on two opposite sides of the semiconductor layer;
    a data storage layer provided in the opening adjacent and in contact with the semiconductor layer;
    and a first conductor provided in the opening separated from the semiconductor layer by the charge storage layer, wherein the semiconductor layer, the first and the second conductive layers are each provided as a planar layer of materials between the first and second dielectric layers the planar layer being substantially parallel the planar surface of the semiconductor substrate.

2. The thin-film storage transistor of claim 1, further comprising second and third conductors adjacent and in electrical contact with the first and the second conductive layers, respectively.

3. The thin-film storage transistor of claim 1, wherein the semiconductor layer, the first and the second conductive layers and the first conductor provide a channel region, a drain region, a source region and a gate electrode of the thin-film storage transistor.

4. The thin-film storage transistor of claim 1, wherein the data storage layer comprises a tunnel dielectric layer, a charge-trapping layer and a blocking dielectric layer.

5. The thin-film storage transistor of claim 4, wherein the blocking dielectric layer comprises silicon oxide and aluminum oxide.

6. The thin-film storage transistor of claim 4, wherein the tunnel dielectric layer and the charge trapping-layer are provided as part of the planar layer of materials between the first and second dielectric layers.

7. The thin-film storage transistor of claim 1, wherein the data storage layer surrounds the first conductor.

8. The thin-film storage transistor of claim 1, wherein the data storage layer is one of two isolated data storage sections within the opening each in contact with both the semiconductor layer and the first conductor.

9. The thin-film storage transistor of claim 3, wherein the first conductor extends along a direction substantially normal to the planar surface of the semiconductor substrate.

10. The thin-film storage transistor of claim 3 wherein charge carriers in the channel travel substantially parallel to the planar surface of the semiconductor substrate.

11. The thin-film storage transistor of claim 7, wherein the thin film storage transistor is one of a plurality of like thin-film storage transistors provided one on top of another above the planar surface of the semiconductor layer, and wherein the first conductor of thin-film storage transistor serves as a common gate electrode for the like thin-film storage transistors.

12. The thin-film storage transistor of claim 3, wherein the thin-film storage transistor is one of a plurality of like thin-film storage transistors located on the same planar layer of materials, and wherein the first conductive layers of the like thin-film storage transistors are in electrical contact with each other forming a common source line and wherein the second conductive layers of the like thin-film storage transistors are in electrical contact with each other forming a common bit line.

13. The thin-film storage transistor of claim 12, further comprising a plurality of global word lines formed above the active layers, wherein word lines signals are communicated exclusively between the first conductors of the like thin-film storage transistors and the global word lines.

14. The thin-film storage transistor of claim 1, wherein the data storage layer comprises a charge-storage layer.

15. The thin-film storage transistor of claim 1, wherein the first and the second conductive layers each comprise a doped semiconductor material.

* * * * *